United States Patent
Wang et al.

(10) Patent No.: US 9,376,567 B1
(45) Date of Patent: Jun. 28, 2016

(54) ORGANIC DYES HAVING RIGID DONOR, PROCESS FOR PRODUCING THE SAME, AND DYE-SENSITIZED SOLAR CELL

(71) Applicant: Changchun Institute of Applied Chemistry Chinese Academy of Sciences, Changchun (CN)

(72) Inventors: Peng Wang, Changchun (CN); Zhaoyang Yao, Changchun (CN)

(73) Assignee: Changchun Institute of Applied Chemistry Chinese Academy of Sciences, Changchun (CN)

( * ) Notice: Subject to any disclaimer, the term of this patent is extended or adjusted under 35 U.S.C. 154(b) by 0 days.

(21) Appl. No.: 14/869,317

(22) Filed: Sep. 29, 2015

(30) Foreign Application Priority Data

Dec. 25, 2014 (CN) .......................... 2014 1 0817172

(51) Int. Cl.
C09B 5/02 (2006.01)
H01L 51/00 (2006.01)
H01G 9/20 (2006.01)

(52) U.S. Cl.
CPC .............. C09B 5/028 (2013.01); H01G 9/2059 (2013.01); H01L 51/0068 (2013.01); H01L 51/0072 (2013.01)

(58) Field of Classification Search
CPC . C09B 5/028; H01L 51/0068; H01L 51/0072; H01G 9/2059
See application file for complete search history.

(56) References Cited

PUBLICATIONS

Jiao et al. "Perylene-Fused BODIPY Dye with Near-IR Absorption/Emission and High Photostability" Organic Letters, 2011, vol. 13, pp. 632-635.*

* cited by examiner

Primary Examiner — Joseph Kosack
(74) Attorney, Agent, or Firm — Cesari and McKenna LLP

(57) ABSTRACT

The present invention provides organic dyes having a rigid donor and the process for producing the same. The organic dye has the structure of formula (i) or formula (ii), wherein $r_1$ is selected from h or $c_1$-$c_{18}$ alkyl; $r_5$ is selected from h, $c_1$-$c_{18}$ alkyl or $c_1$-$c_{18}$ alkoxy; $r_6$ and $r_7$ are independently selected from h, $c_1$-$c_{18}$ alkyl, $c_1$-$c_{18}$ alkoxyphenyl or $c_1$-$c_{18}$ alkylphenyl; x is selected from any one of the groups represented by formulae (a) to (d); y is selected from a group represented by formula (e) or formula (f); in the formula (e), $r_2$ and $r_3$ are independently selected from h, f, $c_1$-$c_{18}$ alkyl or $c_1$-$c_{18}$ alkoxyphenyl; $r_4$ is selected from any one of the groups represented by formulae (g) to (i). The present invention also provides a dye-sensitized solar cell which has a dye layer made from said organic dyes and has a relatively high power conversion efficiency.

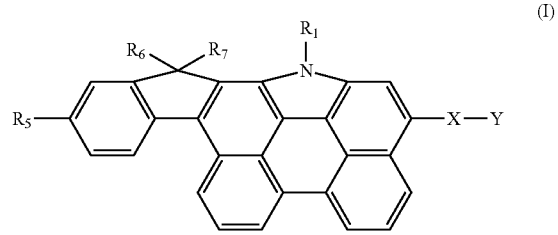

(I)

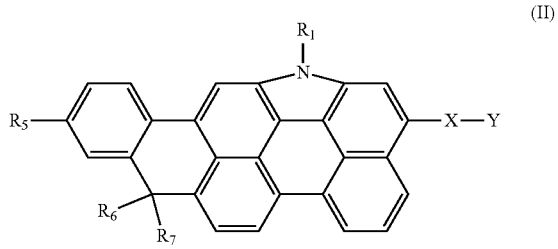

(II)

10 Claims, No Drawings

ORGANIC DYES HAVING RIGID DONOR, PROCESS FOR PRODUCING THE SAME, AND DYE-SENSITIZED SOLAR CELL

CROSS-REFERENCE TO RELATED APPLICATIONS

This application claims the benefit of Chinese Application No. 201410817172.8, filed on Dec. 25, 2014, the content of which is hereby incorporated by reference in its entirety.

BACKGROUND OF THE INVENTION

1. Field of the Invention

The present invention relates to the technical field of dye-sensitized solar cells, in particular, to an organic dye having a rigid donor and a process for producing the same, and a dye-sensitized solar cell.

2. Background Information

Stepping into the 21th century, the energy demand increases dramatically with the fast economic development in China. At present, China has become the largest energy-importing country in the world. Furthermore, environmental problems accompanied with consumption of the ore-based energy, such as fog and haze, are increasing sharply. Therefore, starving for a clean and sustainable energy has continued to prompt the intensive research on the development and utilization of solar energy.

A solar cell is a semiconductor device that can absorb solar light efficiently and convert it to electrical energy. As an important type of solar cells, dye-sensitized solar cells have been widely concerned all over the world. As early as in 1991, Grätzel and his co-workers produced a device by adsorbing $RuL_2(\mu\text{-}(CN)Ru(CN)L'_2)_2$ (L=2,2'-bipyridyl-4,4'-dicarboxylic acid, L'=2,2'-bipyridyl), a trinuclear ruthenium dye on a high quality $TiO_2$ nanocrystalline film, which was developed by Grätzel et al. after the intensive study for many years, and a power conversion efficiency of 7.1% was achieved under the simulated AM1.5G sunlight. Thereby, the widely research of dye-sensitized solar cells was launched. When compared with traditional inorganic semiconductor solar cells, dye-sensitized solar cells are low-cost, colorful and good-looking. Furthermore, flexible dye-sensitized solar cells are well known as their lightweight, foldable and windable properties, which can be broadly used in daily life.

The sensitizer is one of the important components of a dye-sensitized solar cell. At present, most of the commercial available sensitizers are complexes containing ruthenium, which is a noble metal. Since the resource of ruthenium is scarce, it is more practical to develop non-metal organic dyes. However, only a few devices made from purely organic dyes can achieve a power conversion efficiency over 10% currently. The poor efficiency has become a crucial obstacle that puzzles the development of purely organic dyes for a long time.

SUMMARY

In view of above, the object of the present invention is to provide an organic dye having a rigid donor, and a process for producing the same, and a dye-sensitized solar cell. The dye-sensitized solar cell made from the organic dye provided by the present invention has relatively high power conversion efficiency.

The present invention provides an organic dye having a rigid donor, which has the structure of formula (I) or formula (II):

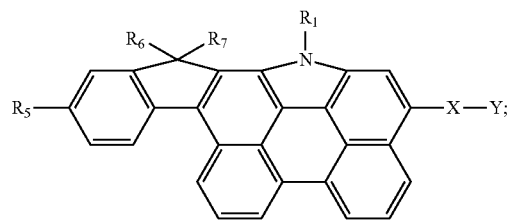

(I)

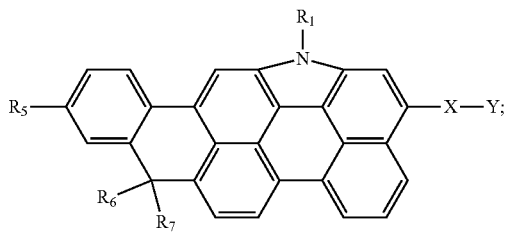

(II)

wherein $R_1$ is selected from H or $C_1$-$C_{18}$ alkyl; $R_5$ is selected from H, $C_1$-$C_{18}$ alkyl or $C_1$-$C_{18}$ alkoxy; $R_6$ and $R_7$ are independently selected from H, $C_1$-$C_{18}$ alkyl, $C_1$-$C_{18}$ alkoxyphenyl or $C_1$-$C_{18}$ alkylphenyl; X is selected from any one of the groups represented by formulae (a) to (d):

(a)
$$-C\equiv C-;$$

(b)
[furan group]

(c)
[thiophene group]

(d)
[selenophene group]

Y is selected from a group represented by formula (e) or formula (f):

(e)
[benzothiadiazole group with $R_2$, $R_3$, $R_4$]

(f)
[cyanoacrylic acid group with COOH, CN]

wherein, in the formula (e), $R_2$ and $R_3$ are independently selected from H, F, $C_1$-$C_{18}$ alkyl or $C_1$-$C_{18}$ alkoxyphenyl; $R_4$ is selected from any one of the groups represented by formulae (g) to (i):

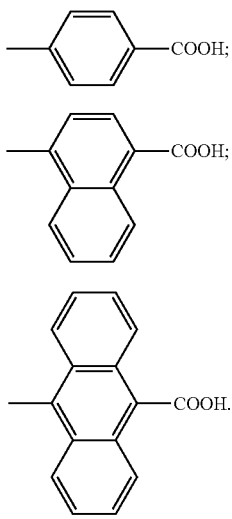

Preferably, $R_1$ is selected from $C_2$-$C_{16}$ alkyl; $R_5$ is selected from $C_2$-$C_{16}$ alkoxy;

$R_6$ and $R_7$ are independently selected from $C_2$-$C_{12}$ alkylphenyl.

Preferably, X is selected from a group represented by the formula (a), formula (c) or formula (d).

Preferably, Y is selected from a group represented by the formula (e);

In formula (e), $R_2$ and $R_3$ is H; $R_4$ is a group represented by the formula (g).

Preferably, X is selected from a group represented by the formula (c) or formula (d); Y is a group represented by the formula (f).

The present invention provides a process for producing an organic dye having a rigid donor, which comprises the following steps:

subjecting a rigid donor compound having the structure of formula (III) to bromination and Heck coupling reaction successively, or subjecting a rigid donor compound having the structure of formula (III) to Suzuki reaction and Stille coupling reaction successively, so as to obtain a first dye precursor ester; and reacting the first dye precursor ester in the presence of a strong base, so as to obtain an organic dye having the structure of formula (I); or subjecting a rigid donor compound having the structure of formula (IV) to bromination and Heck coupling reaction successively, or subjecting a rigid donor compound having the structure of formula (IV) to Suzuki reaction and Stille coupling reaction successively, so as to obtain a second dye precursor ester; and reacting the second dye precursor ester in the presence of a strong base, so as to obtain an organic dye having the structure of formula (II);

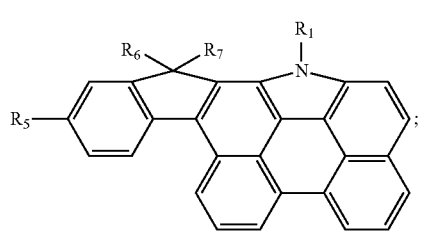
(III)

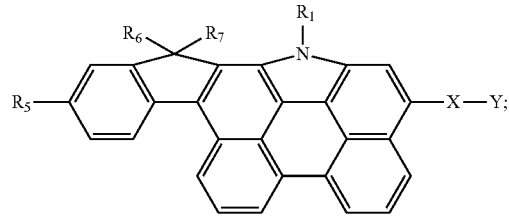
(I)

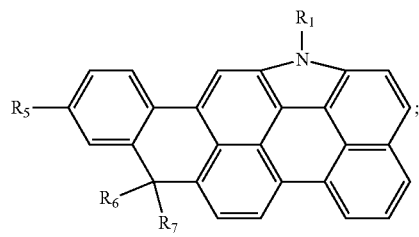
(IV)

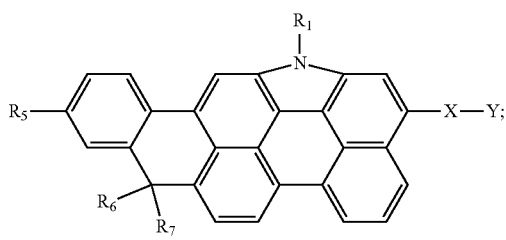
(II)

wherein $R_1$ is selected from H or $C_1$-$C_{18}$ alkyl; $R_5$ is selected from H, $C_1$-$C_{18}$ alkyl or $C_1$-$C_{18}$ alkoxy; $R_6$ and $R_7$ are independently selected from H, $C_1$-$C_{18}$ alkyl, $C_1$-$C_{18}$ alkoxyphenyl or $C_1$-$C_{18}$ alkylphenyl; and X is selected from any one of the groups represented by formulae (a) to (d):

$$-C\equiv C-\quad\text{(a)}$$

(b) furan-2,5-diyl;

(c) thiophene-2,5-diyl;

(d) selenophene-2,5-diyl;

Y is selected from a group represented by formula (e):

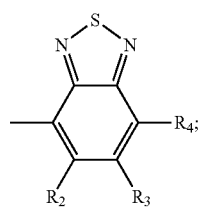
(e)

wherein, in the formula (e), $R_2$ and $R_3$ are independently selected from H, F, $C_1$-$C_{18}$ alkyl or $C_1$-$C_{18}$ alkoxyphenyl; $R_4$ is selected from any one of the groups represented by formulae (g) to (i):

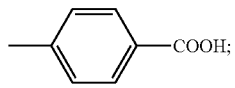
(g)

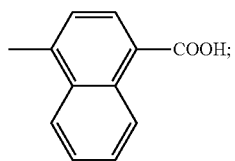
(h)

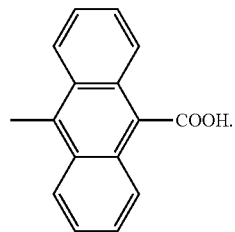
(i)

Preferably, the rigid donor compound having the structure of formula (III) or formula (IV) is prepared in accordance with the following method:

subjecting a compound having the structure of formula (V) to oxidation of Jones reagent, esterification of carboxylic acids, and boronation catalyzed by Pd(dppf)Cl$_2$ and potassium acetate successively, so as to obtain a compound having the structure of formula (VI); subjecting the compound having the structure of formula (VI) and a compound having the structure of formula (VII) to cross-coupling reaction in the presence of palladium acetate, Sphos and potassium phosphate to obtain a carboxylic acid ester, which is then subjected to alkylation reaction in the presence of a Grignard reagent, so as to obtain a compound having the structure of formula (VIII); and subjecting the compound having the structure of formula (VIII) to intramolecular cyclization reaction in presence of an acidic catalyst, so as to obtain the rigid donor compound having the structure of formula (III) or formula (IV);

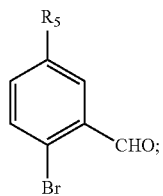
(V)

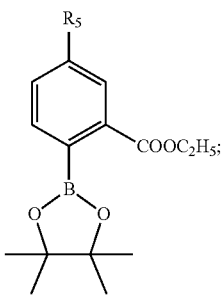
(VI)

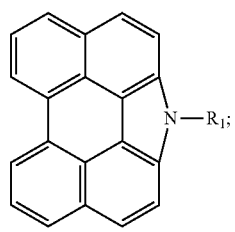
(VII)

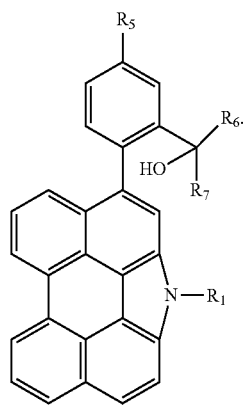
(VIII)

The present invention further provides a process for producing an organic dye having a rigid donor, which comprises the following steps:

reacting a dye precursor aldehyde having the structure of formula (IX) with cyanoacrylic acid in the presence of ammonium acetate, so as to obtain an organic dye having the structure of formula (I); or reacting a dye precursor aldehyde having the structure of formula (X) with cyanoacrylic acid in the presence of ammonium acetate, so as to obtain an organic dye having the structure of formula (II);

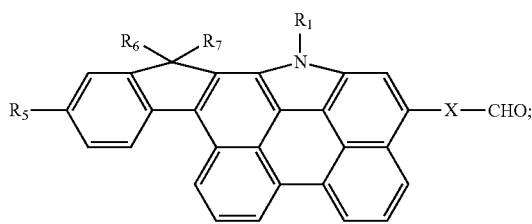
(IX)

-continued

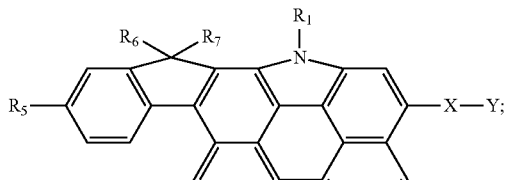
(I)

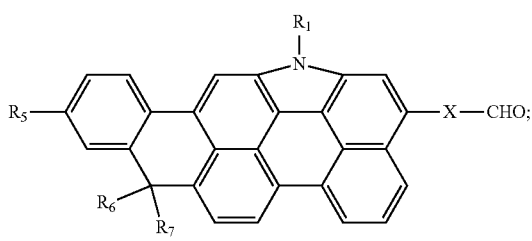
(X)

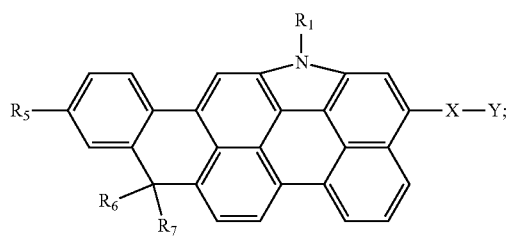
(II)

wherein $R_1$ is selected from H or $C_1$-$C_{18}$ alkyl; $R_5$ is selected from H, $C_1$-$C_{18}$ alkyl or $C_1$-$C_{18}$ alkoxy; $R_6$ and $R_7$ are independently selected from H, $C_1$-$C_{18}$ alkyl, $C_1$-$C_{18}$ alkoxyphenyl or $C_1$-$C_{18}$ alkylphenyl; X is selected from any one of the groups represented by formula (b) to formula (d):

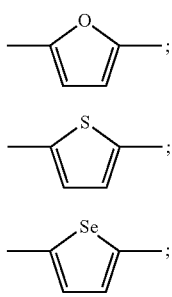

(b)

(c)

(d)

Y is a group represented by formula (f):

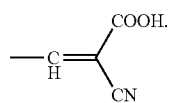

(f)

Preferably, the dye precursor aldehyde having the structure of formula (IX) is produced in accordance with the following method:

reacting a heterocycle-containing compound, N,N-dimethyl formamide and phosphorus oxychloride, so as to obtain the dye precursor aldehyde having the structure of formula (IX); said heterocycle-containing compound has the structure of formula (XI), formula (XII) or formula (XIII):

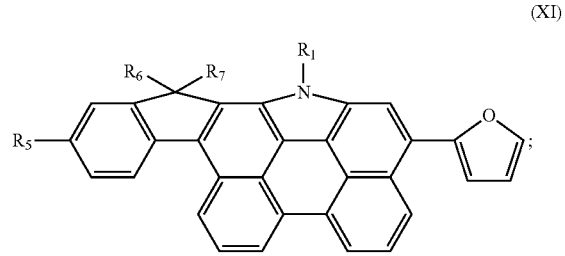
(XI)

(XII)

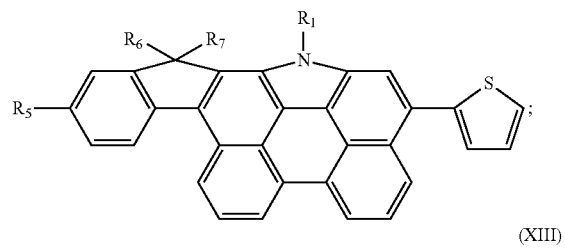
(XIII)

The present invention further provides a dye-sensitized solar cell, wherein the dye layer is made from the organic dyes mentioned above.

As compared with the prior art, the organic dye provided by the present invention have the structure of formula (I) or formula (II). The dye has a rigid coplanar donor unit, and the relative energy level of the molecule is adjusted by various acceptor units and modifying groups, so that the dye-sensitized solar cell made from the dye molecule has improved power conversion efficiency. The results of experiments show that the power conversion efficiency of the dye-sensitized solar cell made from the organic dye provided by the present invention may be up to 12.5%, which is currently in a global leading position.

DETAILED DESCRIPTION

Hereinafter, the present invention will be clearly and fully described with reference to the technical solutions of examples. Obviously, the examples described are only a part of the examples of the present invention, rather than the whole examples. All other examples, which can be obtained by those skilled in the art without any inventive work based on the examples in the present invention, fall into the protection scope of the invention.

The present invention provides an organic dye having a rigid donor, which has the structure of formula (I) or formula (II):

(I)

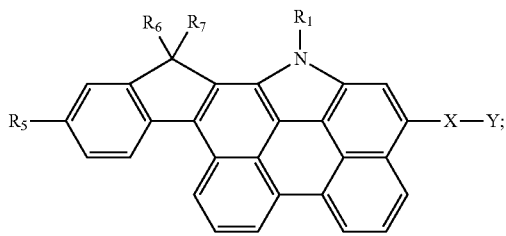

(II)

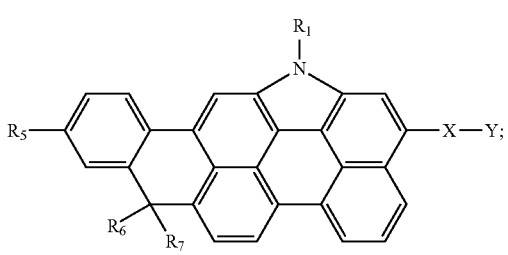

(g)

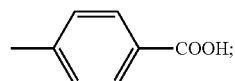

(h)

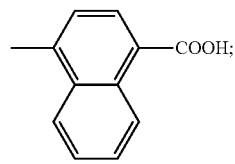

(i)

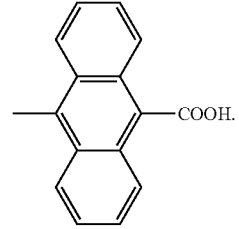

wherein $R_1$ is selected from H or $C_1$-$C_{18}$ alkyl; $R_5$ is selected from H, $C_1$-$C_{18}$ alkyl or $C_1$-$C_{18}$ alkoxy; $R_6$ and $R_7$ are independently selected from H, $C_1$-$C_{18}$ alkyl, $C_1$-$C_{18}$ alkoxyphenyl or $C_1$-$C_{18}$ alkylphenyl; X is selected from any one of the groups represented by formulae (a) to (d):

(a) 

(b) 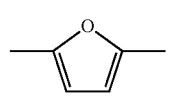

(c) 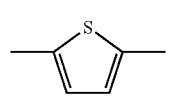

(d) 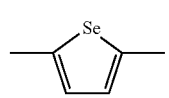

Y is selected from a group represented by formula (e) or formula (f):

(e) 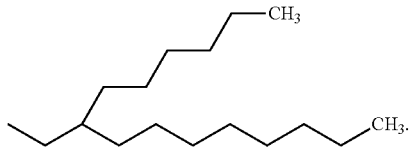

(f) 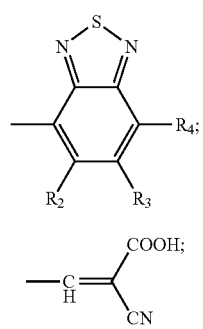

wherein, in the formula (e), $R_2$ and $R_3$ are independently selected from H, F, $C_1$-$C_{18}$ alkyl or $C_1$-$C_{18}$ alkoxyphenyl; $R_4$ is selected from any one of the groups represented by formulae (g) to (i):

The present invention provides an organic dye having a rigid coplanar donor unit. The dye-sensitized solar cell made from the dye molecule has an improved power conversion efficiency, which may be up to 12.5%. This is currently the highest efficiency achieved by a purely organic dye-sensitized solar cell in the world.

The organic dye provided by the present invention has the structure of formula (I) or formula (II). That is, it has a rigid coplanar donor unit, wherein $R_1$ is selected from H or $C_1$-$C_{18}$ alkyl, preferably selected from $C_2$-$C_{16}$ alkyl; and in an embodiment of the present invention, $R_1$ is

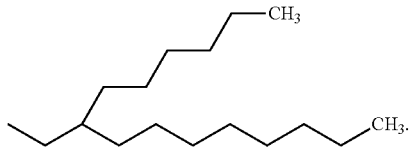

In the present invention, $R_5$ is selected from H, $C_1$-$C_{18}$ alkyl or $C_1$-$C_{18}$ alkoxy, $R_5$ is preferably selected from $C_2$-$C_{16}$ alkoxy; and in an embodiment of the present invention, $R_5$ is

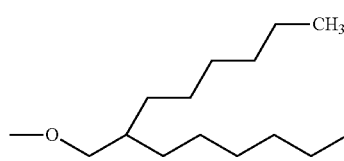

$R_6$ and $R_7$ are independently selected from H, $C_1$-$C_{18}$ alkyl, $C_1$-$C_{18}$ alkoxyphenyl or $C_1$-$C_{18}$ alkylphenyl, preferably selected from $C_2$-$C_{12}$ alkylphenyl; $R_6$ and $R_7$ may be different, or may be same. In an embodiment of the present invention, both of $R_6$ and $R_7$ are p-hexylphenyl.

X is selected from any one of the groups represented by formulae (a) to (d), in which the group represented by formula (a) is a carbon-carbon triple bond, the group represented by formula (b) is a furan group, the group represented by formula (c) is a thiophene group, and the group represented by formula (d) is a selenophene group; and Y is selected from a group represented by formula (e) or formula (f). When Y is selected from a group represented by formula (e), X may be a group represented by formula (a), formula (c) or formula (d); when Y is a group represented by formula (f), X is preferably any of the groups represented by formulae (b) to (d). In an embodiment of the present invention, Y is a group represented by formula (f), and X is selected from a group represented by formula (c) or formula (d).

In the present invention, Y is preferably selected from a group represented by formula (e); and in formula (e), $R_2$ and $R_3$ are independently selected from H, F, $C_1$-$C_{18}$ alkyl or $C_1$-$C_{18}$ alkoxyphenyl. In a preferred embodiment of the present invention, both of $R_2$ and $R_3$ are H.

In formula (e), $R_4$ is selected from any one of the groups represented by formulae (g) to (i); and in an embodiment of the present invention, $R_4$ is a group represented by formula (g). The present invention uses a rigid coplanar donor unit, and the relative energy level of the molecule is adjusted by various acceptor units and modifying groups, so that the dye-sensitized solar cell made from the dye molecule has an improved power conversion efficiency.

In the present invention, the organic dye preferably has the structure of formula (I-a-e), formula (I-c-e), formula (I-d-e), formula (II-a-e), formula (II-c-e), formula (II-d-e) or formula (II-f-e):

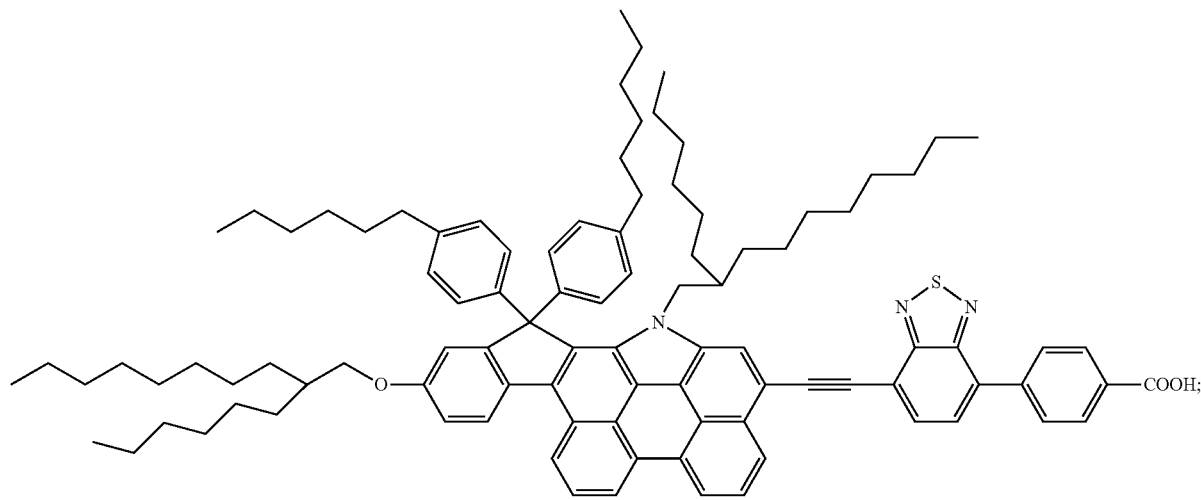

(I-a-e)

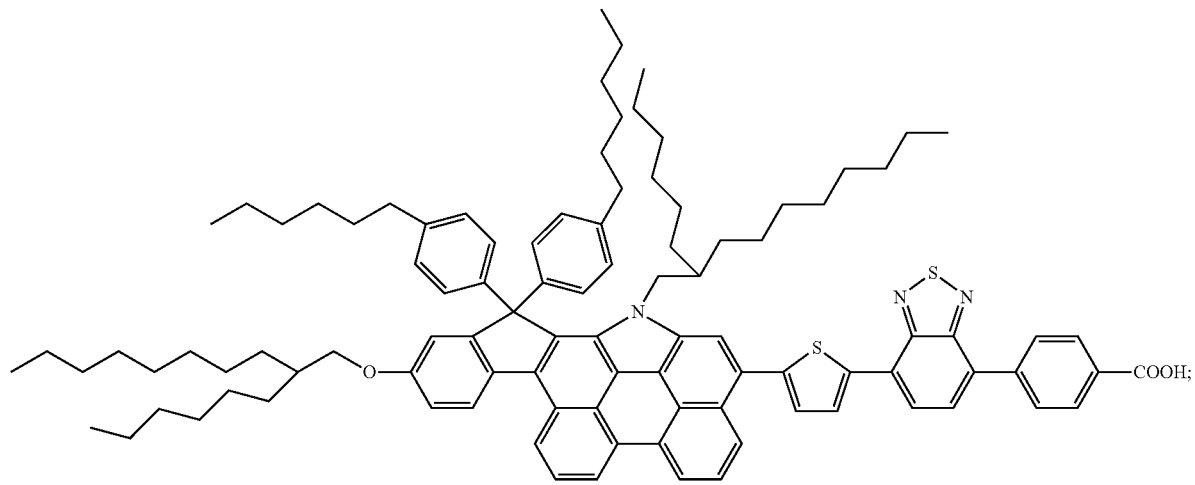

(I-c-e)

(I-d-e)
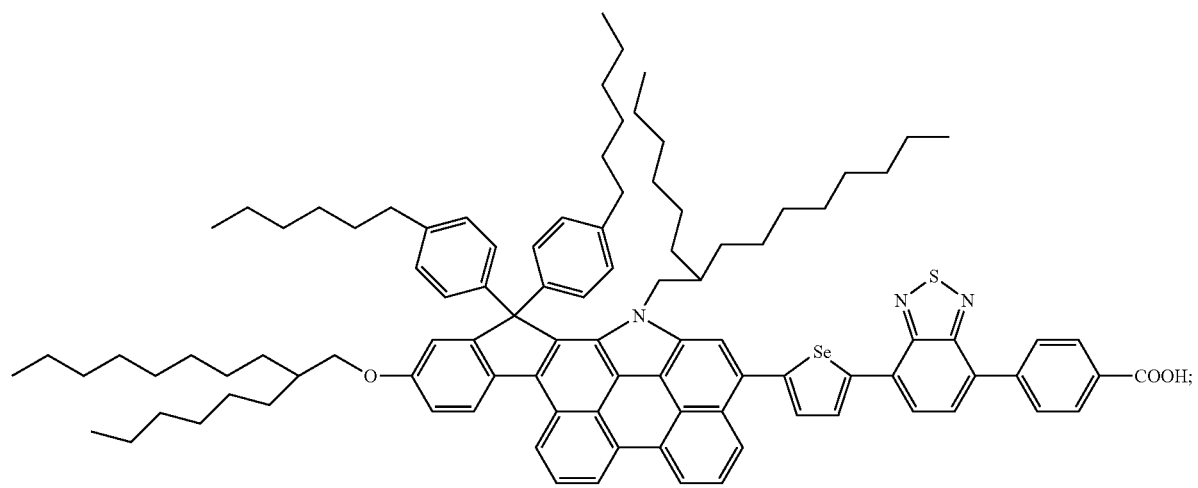
(II-a-e)
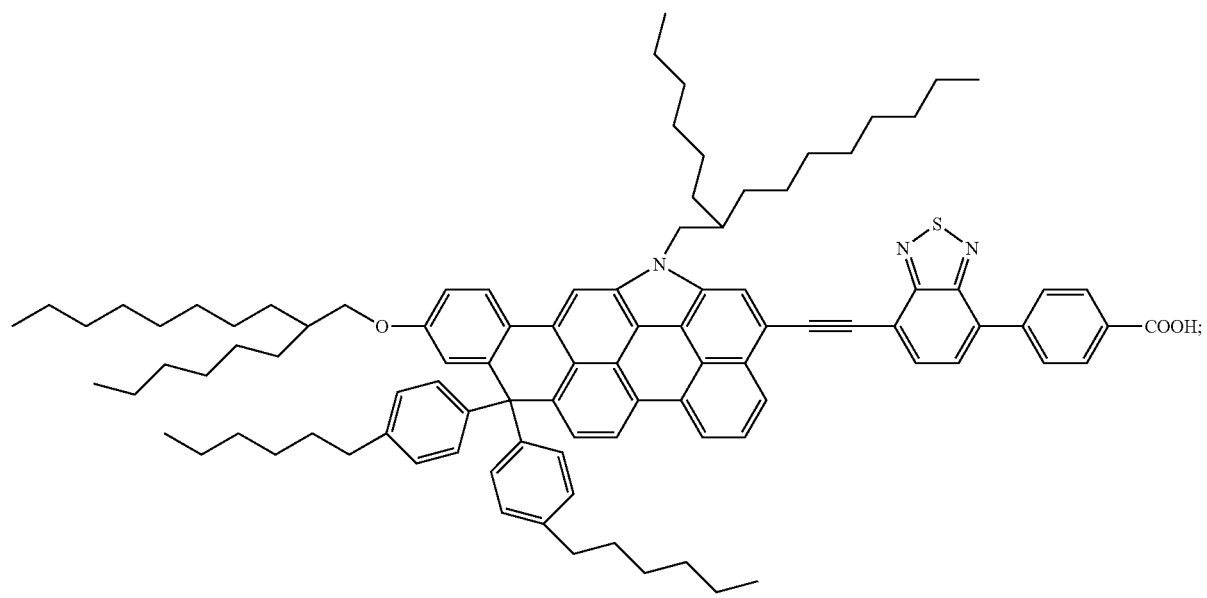

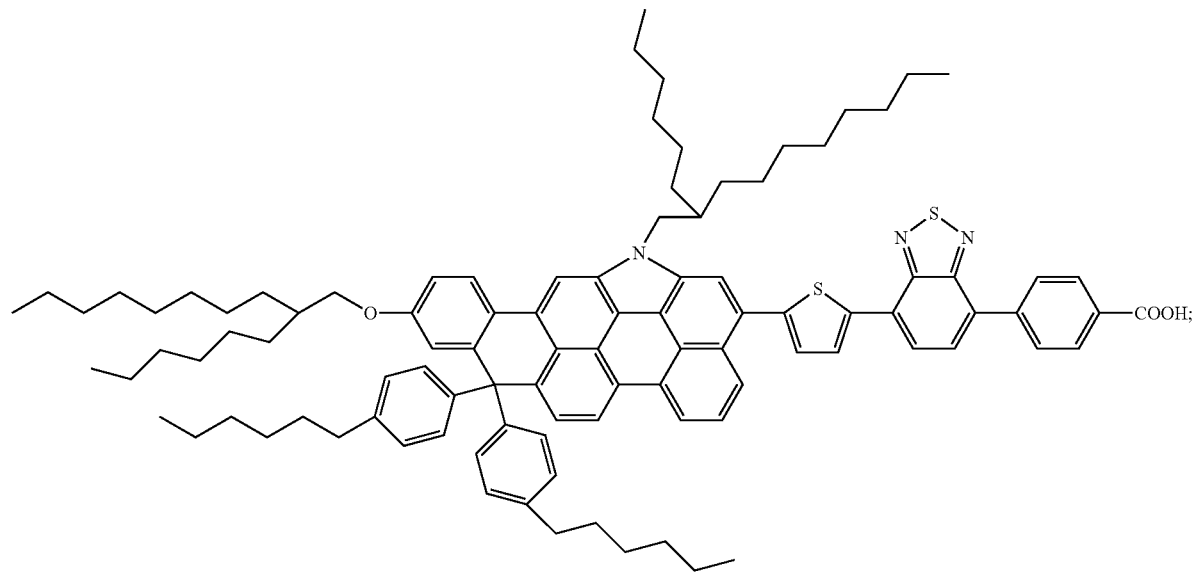
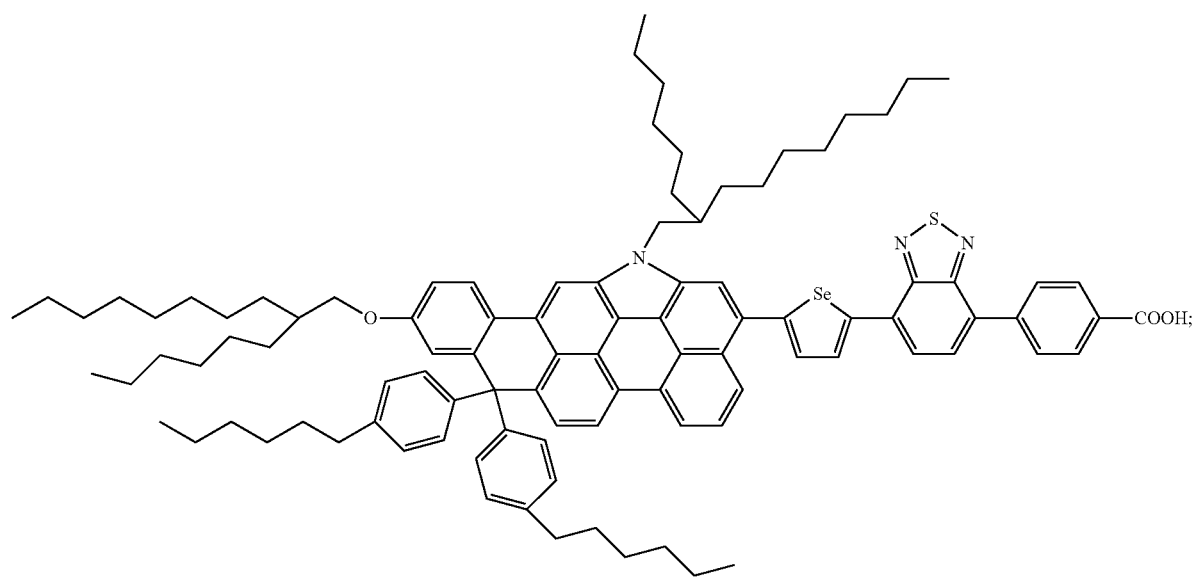

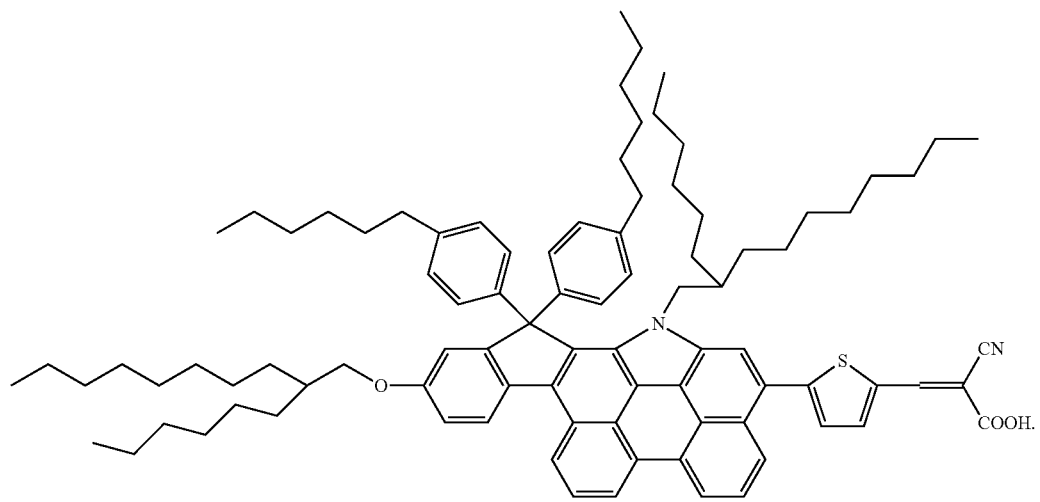
(I-c-f)

At the same time, the present invention provides a process for producing an organic dye having a rigid donor, which comprises:

subjecting a rigid donor compound having the structure of formula (III) to bromination and Heck coupling reaction successively, or subjecting a rigid donor compound having the structure of formula (III) to Suzuki reaction and Stille coupling reaction successively, so as to obtain a first dye precursor ester; and reacting the first dye precursor ester in the presence of a strong base, so as to obtain an organic dye having the structure of formula (I); or subjecting a rigid donor compound having the structure of formula (IV) to bromination and Heck coupling reaction successively, or subjecting rigid donor compound having the structure of formula (IV) to Suzuki reaction and Stille coupling reaction successively, so as to second dye precursor ester; and reacting the second dye precursor ester in the presence of a strong base, so as to obtain an organic dye having the structure of formula (II);

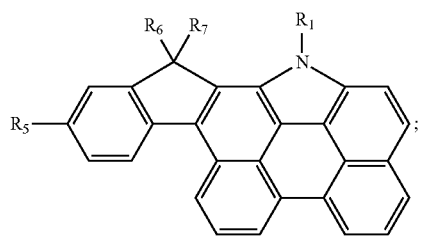
(III)

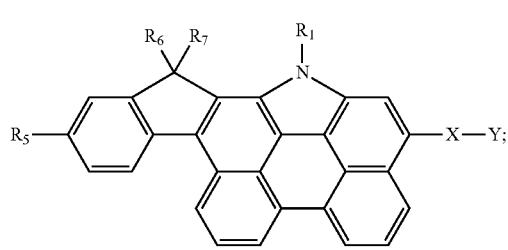
(I)

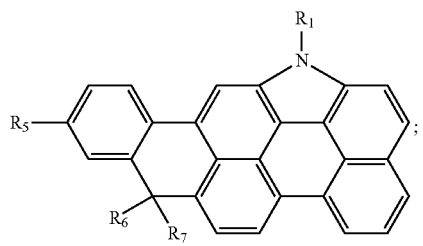
(IV)

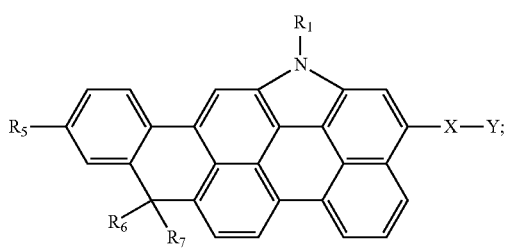
(II)

wherein $R_1$ is selected from H or $C_1$-$C_{18}$ alkyl; $R_5$ is selected from H, $C_1$-$C_{18}$ alkyl or $C_1$-$C_{18}$ alkoxy; $R_6$ and $R_7$ are independently selected from H, $C_1$-$C_{18}$ alkyl, $C_1$-$C_{18}$ alkoxyphenyl or $C_1$-$C_{18}$ alkylphenyl; X is selected from any one of the groups represented by formulae (a) to (d):

(a)

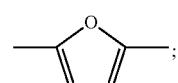
(b)

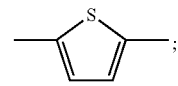
(c)

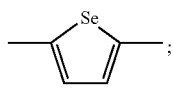
(d)

Y is selected from a group represented by formula (e):

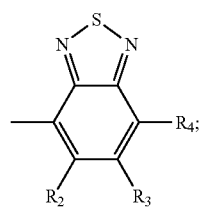
(e)

wherein in the formula (e), $R_2$ and $R_3$ are independently selected from H, F, $C_1$-$C_{18}$ alkyl or $C_1$-$C_{18}$ alkoxyphenyl; $R_4$ is selected from any one of the groups represented by formulae (g) to (i):

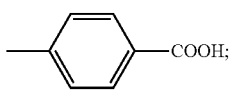
(g)

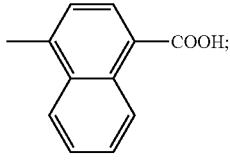
(h)

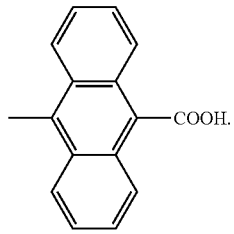
(i)

The present invention provides synthesis processes for several kinds of organic dye. The dye-sensitized solar cells made from the synthesized organic dyes have a relatively high power conversion efficiency.

In an embodiment of the present invention, a rigid donor compound is subjected to bromination and Heck coupling reaction successively, or subjected to Suzuki reaction and Stille coupling reaction successively, so as to obtain a dye precursor ester. In the present invention, the rigid donor compound has the structure of formula (III) or formula (IV), wherein the contents of $R_1$, $R_5$, $R_6$ and $R_7$ are same as those mentioned above, which are not described here for brevity.

Preferably, the rigid donor compound having the structure of formula (III) or formula (IV) is prepared in accordance with the following method: subjecting a compound having the structure of formula (V) to oxidation of Jones reagent, esterification of carboxylic acids, and boronation catalyzed by Pd(dppf)Cl$_2$ and potassium acetate, successively, so as to obtain a compound having the structure of formula (VI); subjecting the compound having the structure of formula (VI) and a compound having the structure of formula (VII) to cross-coupling reaction in the presence of palladium acetate, Sphos and potassium phosphate, so as to obtain a carboxylic acid ester, which is then subjected to alkylation reaction in the presence of a Grignard reagent, so as to obtain a compound having the structure of formula (VIII); and subjecting the compound having the structure of formula (VIII) to intramolecular cyclization reaction under acidic catalysis, so as to obtain the rigid donor compound having the structure of formula (III) or formula (IV);

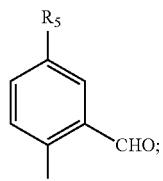
(V)

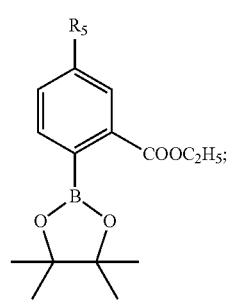
(VI)

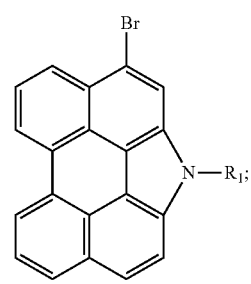
(VII)

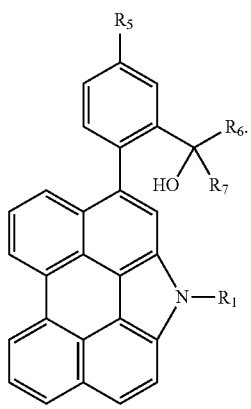
(VIII)

In the process for producing the rigid donor compound, the compound having the structure of formula (V) can be purchased, or can be produced by methods well-known in the art.

When subjecting the compound having the structure of formula (V) to oxidation of Jones reagent, acetone can be used as a solvent. After cooling to 0° C. in an ice-bath, the Jones reagent which is well-known by those skilled in the art is added. The temperature is increased, and the reaction is performed under reflux while stirring. The reaction time can be 72 hours. After the reaction is finished, a carboxylic acid intermediate is obtained by extraction, concentration and column chromatography using chloroform as the eluent.

After the carboxylic acid intermediate is obtained, in an embodiment of the present invention, the carboxylic acid intermediate and ethanol are subjected to esterification of carboxylic acids. The esterification of carboxylic acids is a reaction well-known by those skilled in the art. For example, the reaction is performed by heating and under reflux while stirring in the presence of concentrated sulfuric acid as a catalyst. The reaction time may be 12 hours. After the reaction is finished, a carboxylic acid ester intermediate is obtained by extraction, concentration and column chromatography using chloroform as the eluent.

After the carboxylic acid ester intermediate is obtained, in an embodiment of the present invention, the carboxylic acid ester intermediate is subjected to boronation catalyzed by Pd(dppf)Cl$_2$ and potassium acetate, so as to obtain the compound having the structure of formula (VI). The raw materials for boronation include bis(pinacolato)diboron, and the catalyst includes Pd(dppf)Cl$_2$. The reaction can be performed in dimethylsulfoxide under the protection of argon. The reaction temperature may be about 45° C. After the reaction is finished, a compound having the structure of formula (VI) intermediate is obtained by extraction, concentration and column chromatography using ethyl acetate/petroleum ether as the eluent.

After the compound having the structure of formula (VI) intermediate is obtained, in an embodiment of the present invention, the compound having the structure of formula (VI) intermediate and the compound having the structure of formula (VII) are subjected to cross-coupling reaction in the presence of palladium acetate, Sphos and potassium phosphate, so as to obtain a carboxylic acid ester, wherein the compound having the structure of formula (VII) can be purchased, or can be prepared. In an embodiment of the present invention, the compound having the structure of formula (VII) is synthesized according to the reference document (W. Jiang, H. Qian, Y. Li, Z. Wang, *J. Org. Chem.* 2008, 73, 7369.), wherein R$_1$ is

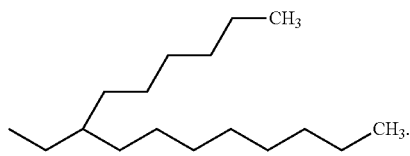 [SMILES: CCCCCCCCC(CC)CCCCCC]

Other raw material compounds, solvents and catalysts used in the dye production process of the present invention are not particularly limited, which can be products available in the market, or can be prepared according to the methods well-known in the art.

When the compound having the structure of formula (VI) and the compound having the structure of formula (VII) are subjected to cross-coupling reaction, the catalyst includes palladium acetate (Pd(OAc)$_2$). The Sphos used is an organic phosphorus ligand, 2-biscyclohexylphosphino-2',6'-dimethoxybiphenyl. The reaction temperature may be 120° C., and the reaction time may be 3 hours. After the reaction is finished, a carboxylic acid ester is obtained by extraction, concentration and column chromatography using ethyl acetate/petroleum ether as the eluent.

After the carboxylic acid ester is obtained, in an embodiment of the present invention, the carboxylic acid ester is subjected to alkylation reaction in the presence of a Grignard reagent, so as to obtain a compound having the structure of formula (VIII). The Grignard reagent used herein can be those well-known by those skilled in the art. In an embodiment of the present invention, the Grignard reagent is p-hexylphenyl magnesium bromide. The alkylation can be performed in tetrahydrofuran. The reaction temperature may be 90° C.

After the reaction is finished, the reaction system is cooled to 0° C. A mixture solution is obtained by adding water, and then extracted with chloroform three times. The organic phases are combined and dried over anhydrous sodium sulfate. The desiccant is removed by filtration, and the filtrate is concentrated to give a brown viscous liquid, which is directly used in the next reaction step without being separated.

After the compound having the structure of formula (VIII) is obtained, in an embodiment of the present invention, the compound having the structure of formula (VIII) is subjected to intramolecular cyclization reaction under acidic catalysis. After separation, a rigid donor compound having the structure of formula (III) or formula (IV) is obtained, wherein a solid acid catalyst, Amberlyst 15, can be used to perform the acidic catalysis. The intramolecular cyclization reaction is performed under the protection of argon. The temperature is increased to reflux, and the reaction is kept overnight.

After the reaction is finished, the reaction system is cooled to room temperature. A mixture solution is obtained by adding water, and then extracted with chloroform three times. The organic phases are combined and dried over anhydrous sodium sulfate. The desiccant is removed by filtration, and the filtrate is concentrated and then was separated by column chromatography using petroleum ether as the eluent, and a rigid donor compound having the structure of formula (III) or formula (IV) is obtained after separation.

After the rigid donor compound having the structure of formula (III) is obtained, in an embodiment of the present invention, the rigid donor compound having the structure of formula (III) is further brominated. After Heck coupling reaction, a first dye precursor ester is synthesized, wherein the bromination reaction is well-known by those skilled in the art. For example, the bromination reaction can be performed by using N-bromosuccinylimine in tetrahydrofuran at 0° C. The reaction time may be 3 hours. After the reaction is finished, a brominated rigid donor compound intermediate is obtained by extraction, concentration and column chromatography using ethyl acetate/petroleum ether as the eluent.

After the brominated rigid donor compound intermediate is obtained, in an embodiment of the present invention, the brominated rigid donor compound intermediate and an acceptor ester compound are subjected to Heck coupling reaction, so as to obtain a first dye precursor ester. The Heck coupling reaction is well-known by those skilled in the art. For example, the reaction can be performed in the presence of cesium carbonate, a catalyst Pd(dba)$_3$ and an organophosphine ligand P(t-Bu)$_3$. The acceptor ester compound comprises a carbon-carbon triple bond, and can be conventionally available in the market, or can be prepared according to the well-known methods. The reaction temperature may be 120° C. The reaction is kept overnight.

Or, after the rigid donor compound having the structure of formula (III) is obtained, in an embodiment of the present invention, the rigid donor compound having the structure of formula (III) and thiophene boric acid or the like are subjected to Suzuki reaction, and then the product is subjected to Stille coupling reaction, so as to synthesize a first dye precursor ester, wherein the Suzuki reaction is well-known by those skilled in the art. The raw material thiophene boric acid used in an embodiment of the present invention can be purchased from the market. A specific heterocycle-containing compound intermediate can be obtained via a reaction under the conditions of a temperature of 45° C. and the presence of catalyst for 12 hours, etc.

Then, the product obtained from the Suzuki reaction and the acceptor ester compound are subjected to Stille coupling reaction, so as to obtain a first dye precursor ester. The Stille coupling reaction is well-known by those skilled in the art. The raw material acceptor ester compound used in an embodiment of the present invention can be synthesized according to the document (Zhang, M.; Wang, Y.; Xu, M.; Ma, W.; Li, R.; Wang, P. *Energy Environ. Sci.* 2013, 6, 2944-2949). The organotin in the Stille coupling reaction may be trimethyl tin chloride, and the reaction is heated to room temperature and kept overnight. Other raw material compounds, solvents and catalysts used in the production process of the dye of the present invention are not particularly limited, which can be products available in the market, or can be prepared according to the methods well-known in the art.

After the first dye precursor ester is obtained, in an embodiment of the present invention, the first dye precursor ester is reacted in the presence of strong base such as KOH. The reaction temperature may be 80° C. The reaction is performed under stirring for a certain period, such as 5 hours, so as to obtain an organic dye having the structure of formula (I).

When the rigid donor compound obtained in an example of the invention has the structure of formula (IV), an organic dye having the structure of formula (II) can be obtained by the reaction route mentioned above. In other words, in an embodiment of the present invention, the rigid donor compound having the structure of formula (IV) is subjected to bromination and Heck coupling reaction successively, or, the rigid donor compound having the structure of formula (IV) is subjected to Suzuki reaction and Stille coupling reaction successively, so as to obtain a second dye precursor ester. The second dye precursor ester is reacted in the presence of strong base, so as to obtain an organic dye having the structure of formula (II), wherein there is no particular limitation for the compounds and reaction conditions in each reaction.

With the above-mentioned process of the present invention, an organic dye having the structure of formula (I) or formula (II) is obtained, wherein X is selected from any one of the groups represented by formulas (a) to (d); Y is selected from a group represented by formula (e), and in the formula (e), $R_2$, $R_3$ and $R_4$ are same as those mentioned above, which are not described here for brevity.

For different acceptor units, the present invention further provides a process for producing an organic dye having a rigid donor, which comprises the following steps:

reacting a dye precursor aldehyde having the structure of formula (IX) with cyanoacrylic acid in the presence of ammonium acetate, so as to obtain an organic dye having the structure of formula (I); or reacting a dye precursor aldehyde having the structure of formula (X) with cyanoacrylic acid in the presence of ammonium acetate, so as to obtain an organic dye having the structure of formula (II),

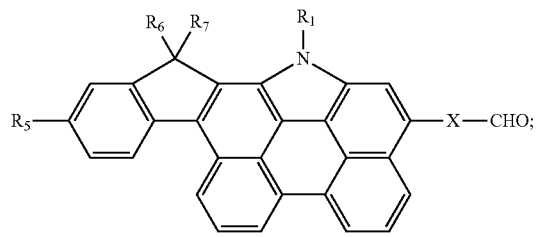

(IX)

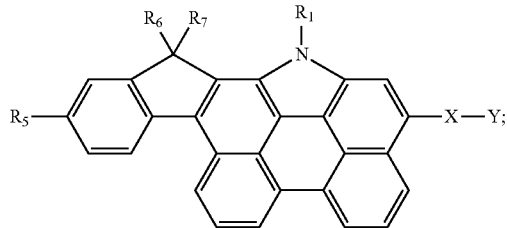

(I)

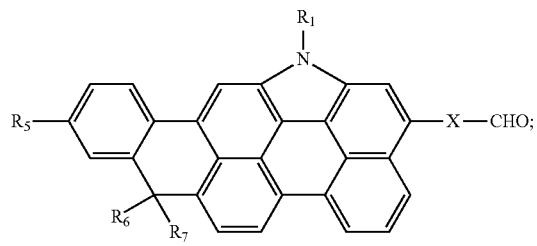

(X)

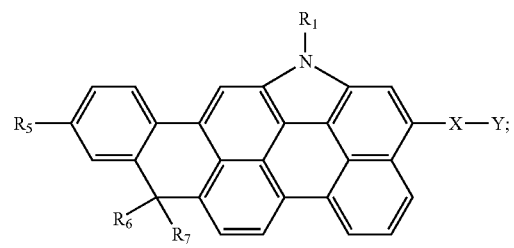

(II)

wherein $R_1$ is selected from H or $C_1$-$C_{18}$ alkyl; $R_5$ is selected from H, $C_1$-$C_{18}$ alkyl or $C_1$-$C_{18}$ alkoxy; $R_6$ and $R_7$ are independently selected from H, $C_1$-$C_{18}$ alkyl, $C_1$-$C_{18}$ alkoxyphenyl or $C_1$-$C_{18}$ alkylphenyl; X is selected from any one of the groups represented by formulae (b) to (d):

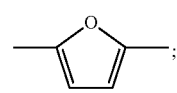

(b)

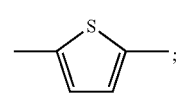

(c)

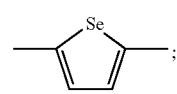

(d)

Y is a group represented by formula (f):

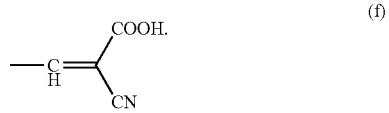

In an embodiment of the present invention, the dye precursor aldehyde and a cyanoacrylic acid are reacted in the presence of ammonium acetate, so as to obtain an organic dye. In the present invention, the dye precursor aldehyde has the structure of formula (IX) or formula (X), wherein the contents of $R_1$, $R_5$, $R_6$ and $R_7$ are same as those mentioned above, which are not described here for brevity; X is selected from any one of the groups represented by formulae (b) to (d).

Preferably, the dye precursor aldehyde having the structure of formula (IX) is prepared in accordance with the following method: a heterocycle-containing compound, N,N-dimethyl formamide and phosphorus oxychloride are reacted to obtain the dye precursor aldehyde having the structure of formula (IX); said heterocycle-containing compound having the structure of formula (XI), formula (XII) or formula (XIII):

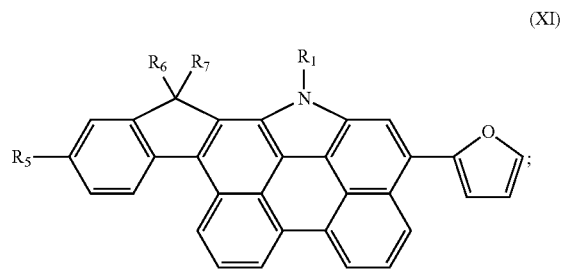

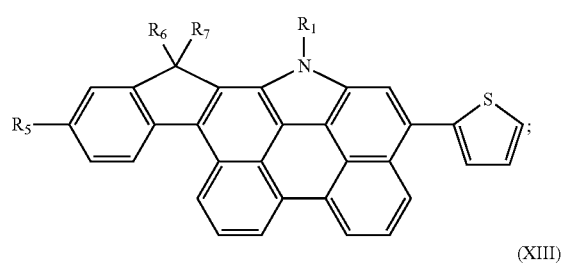

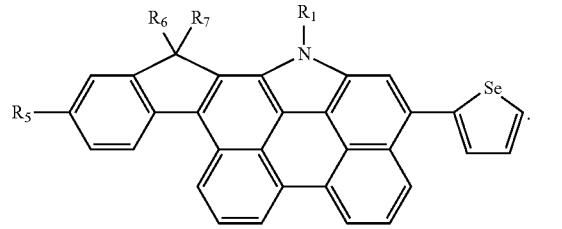

In the process for producing the dye precursor aldehyde, the heterocycle-containing compound has the structure of formula (XI), formula (XII), or formula (XIII). In an embodiment of the present invention, the heterocycle-containing compound has the structure of formula (XII). The heterocycle-containing compound may be conventionally available in the market, or can be prepared by the methods well-known in the art. There is no particular limitation in the present invention.

In an embodiment of the present invention, the heterocycle-containing compound is dissolved in 1,2-dichloroethane in a dry Schlenk reaction flask, and then the reaction system is cooled to 0° C. in an ice bath; a certain amount of N,N-dimethyl formamide and phosphorus oxychloride are add to the reaction system, and then the reaction is heated to 40° C. and kept overnight.

After the reaction is finished, the above-mentioned reaction system is cooled to room temperature. Water is added, and then the mixture is stirred and extracted with chloroform three times. The organic phases are combined and dried over anhydrous sodium sulfate. The desiccant is removed by filtration, the filtrate is concentrated, and then was separated by column chromatography using ethyl acetate/petroleum ether as the eluent, and a dye precursor aldehyde having the structure of formula (IX) is obtained.

In the present invention, when another type of the heterocycle-containing compound is used, the dye precursor aldehyde having the structure of formula (X) can be obtained in accordance with the above-mentioned reaction route, wherein there is no particular limitation for the compounds and reaction conditions in each reaction.

After the dye precursor aldehyde having the structure of formula (IX) is obtained, in an embodiment of the present invention, the dye precursor aldehyde having the structure of formula (IX) is dissolved in a solvent, and then cyanoacrylic acid and ammonium acetate are added thereto. The mixture is heated to reflux to give an organic dye having the structure of formula (I), wherein Y is a group represented by formula (f).

In the present invention, the solvent for dissolving the dye precursor aldehyde may be a mixed solvent of acetonitrile and dichloromethane. The reaction time can be 48 hours. After the reaction is finished, the above-mentioned reaction system is cooled to room temperature. Water is added, and then the mixture is stirred and extracted with chloroform three times. The organic phases are combined and dried over anhydrous sodium sulfate. The desiccant is removed by filtration, and the filtrate is concentrated and then was separated by column chromatography using methanol/chloroform as the eluent to give the target product.

Or, after the dye precursor aldehyde having the structure of formula (X) is obtained, in an embodiment of the present invention, the dye precursor aldehyde having the structure of formula (X) and a cyanoacrylic acid are reacted in the presence of ammonium acetate, so as to obtain an organic dye having the structure of formula (II), wherein Y is a group represented by formula (f).

The structure of the product in the present invention is characterized by NMR, mass spectrometry and elemental analysis. In particular, in examples of the present invention, an organic dye having the structure of formula (I-a-e), formula (I-c-e), formula (I-d-e), formula (II-a-e), formula (II-c-e), formula (II-d-e) or formula (I-c-f) can be prepared.

The present invention provides a dye-sensitized solar cell, in which a dye layer is made from the organic dye mentioned above. The power conversion efficiency of the dye-sensitized solar cell made from the organic dye provided by the present invention may be up to 12.5%. This is currently the highest efficiency achieved by a purely organic dye-sensitized solar cell in the world.

The dye-sensitized solar cell provided by the present invention comprises: first and second transparent substrate layer opposite from each other; a conducting layer; a light absorption layer; a hole transport layer and a counter electrode. The conducting layer, the light absorption layer, the hole transport layer and the counter electrode are connected successively between the first and second transparent substrate layer. The light adsorption layer comprises a semiconductor micro/nanoparticle layer and a dye layer. The semiconductor micro/nanoparticle layer is connected to the conducting layer, while the dye layer is connected to the hole transport layer, wherein the dye layer is made from the organic dye mentioned above.

In the present invention, except the dye layer, all of the transparent substrate layers, the conducting layer, the light adsorption layer and the like are component parts of a dye-sensitized solar cell, which are well-known by those skilled in the art. The process for producing the dye-sensitized solar cell is not particularly limited in the present invention. The solar cell can be produced in accordance with the methods well-known by those skilled in the art. For example, the organic dye-sensitized solar cell can be produced according to the document (*Energy Environ. Sci.*, 2010, 3, 1924), as long as the dye layer thereof is the dye mentioned above.

Preferably, in the present invention, the $TiO_2$ nanostructural film sintered on the FTO conductive glass is immersed in a solution of the organic dye. After the film is taken out, the glass electrode coated with nano-platinum is sealed annularly by a hot melt method. At last, an electrolyte is filled into the gap between the two electrodes, and a dye-sensitized solar cell is constructed.

Herein, the solvent of the organic dye solution is preferably a mixture of ethanol and toluene, wherein the volume ratio of ethanol to toluene is preferably (5-20):1. The concentration of the organic dye solution is preferably 50 μmol/L to 200 μmol/L. The immersion time is preferably 8 to 20 hours. The immersion temperature is preferably at room temperature.

After the dye-sensitized solar cell is obtained, in the present invention, the performances of the resultant dye-sensitized solar cell are measured under the simulated AM1.5G sunlight at 100 mW·cm$^{-2}$. The results show that the organic dye-sensitized solar cell made from the organic dye provided by the present invention has a relatively high cell efficiency.

For further understanding the present application, the organic dye having a rigid donor, the production process thereof, and the dye-sensitized solar cell provided by the present application are described in detail with reference to Examples. In the following Examples, the compound 6 was synthesized according to the reference document (W. Jiang, H. Qian, Y. Li, Z. Wang, *J. Org. Chem.* 2008, 73, 7369.). The compound 13 and the compound 17 were purchased from Acros Organics. The compound 15 was synthesized according to the reference document (Zhang, M.; Wang, Y.; Xu, M.; Ma, W.; Li, R.; Wang, P. *Energy Environ. Sci.* 2013, 6, 2944).

Example 1

The reaction scheme is shown as follows:

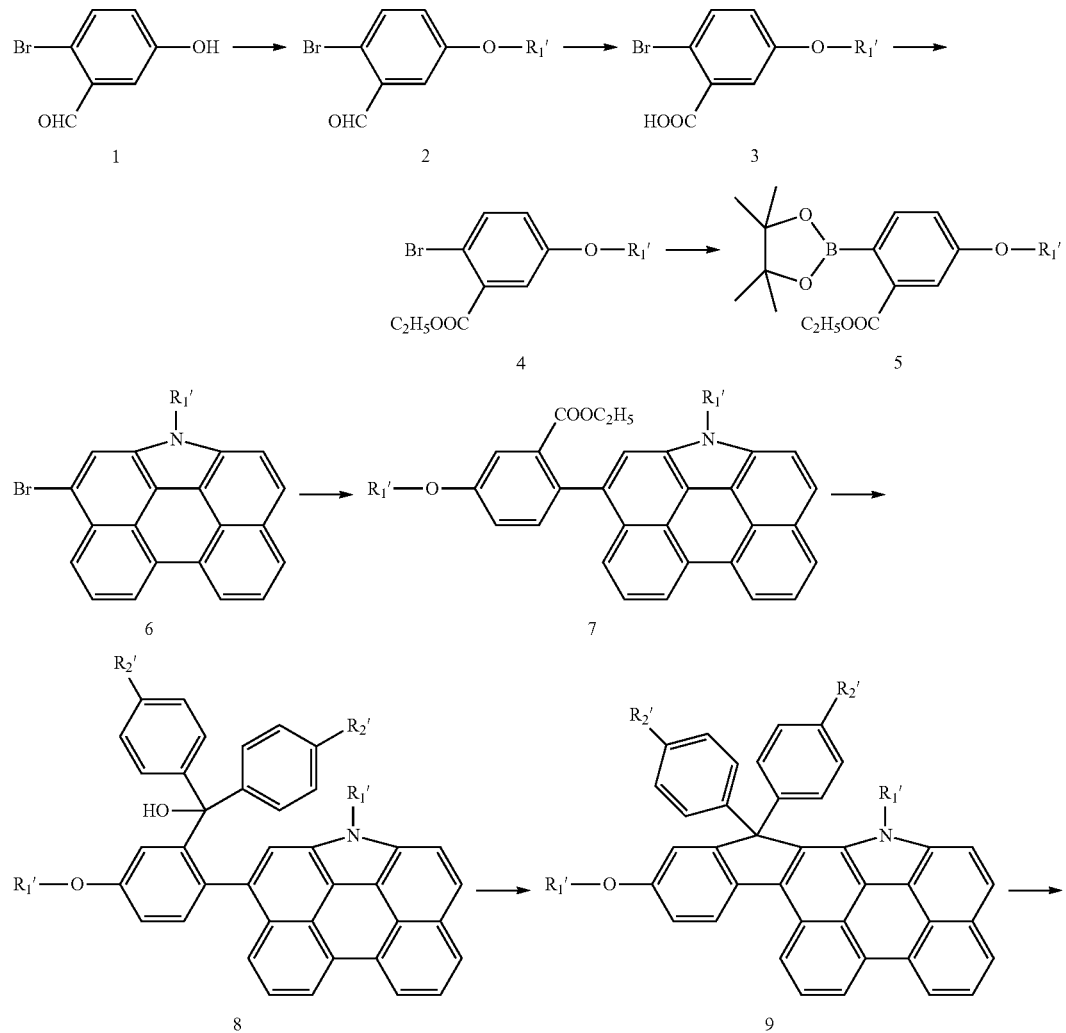

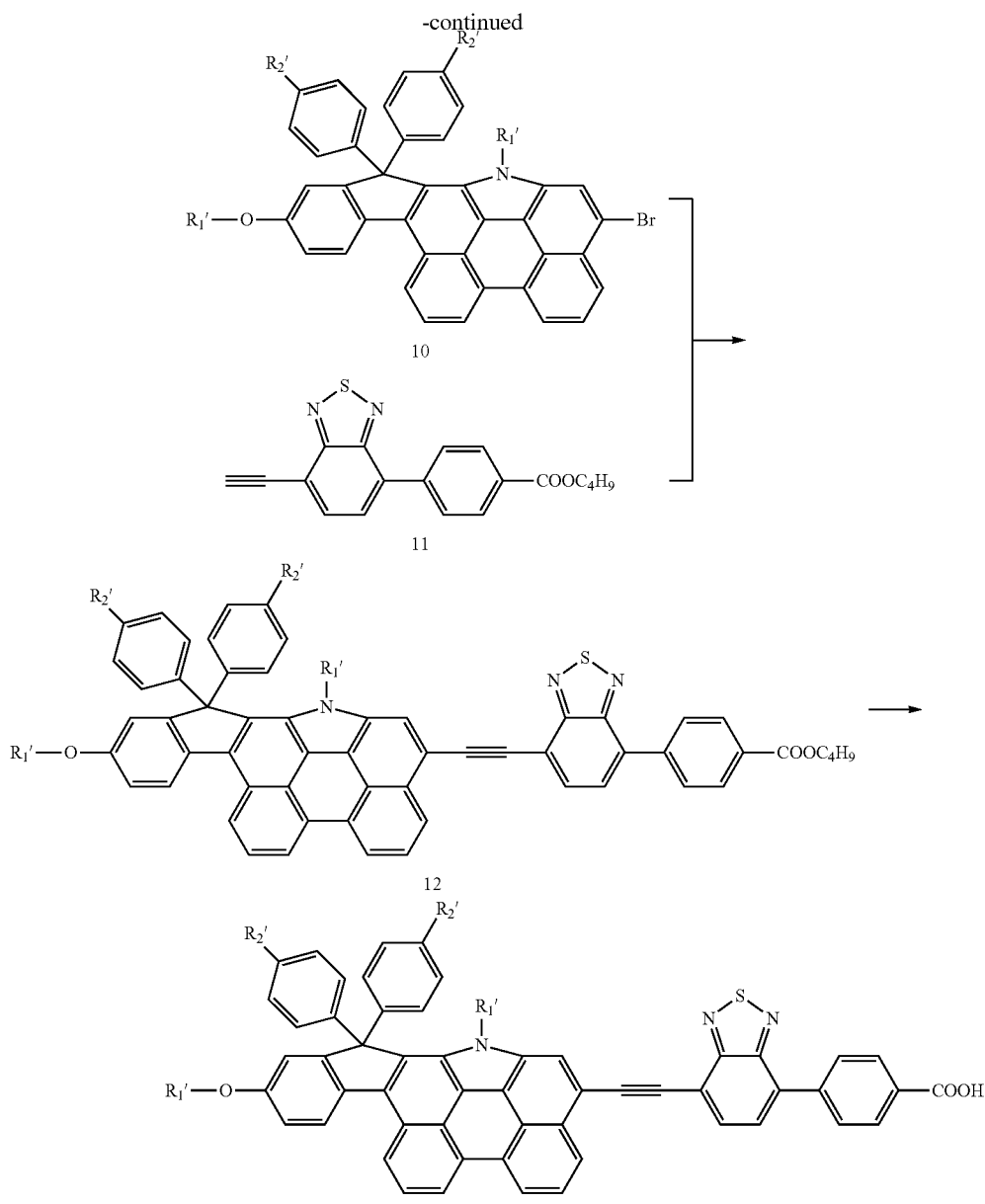

Formula I-a-e wherein $R_1'$ is

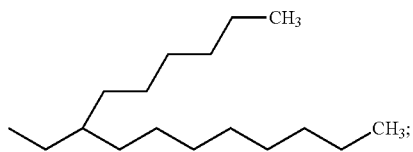 [SMILES: CCCCCCCCC(CC)CCCCCC]

$R_2'$ is hexyl. Also, in the following Examples, they are the same as in this Example.

1.1 Synthesis of the Intermediate 2

In a three-necked round-bottom flask, 2.00 g of the compound 1 was dissolved in 20 mL N,N-dimethyl formamide. 4.33 g 2-hexyldecyl-4-methylbenzenesulfonate and 2.13 g potassium hydroxide were added to the reaction system, and then the mixture is heated to 100° C. and reacted under stirring, and the reaction is kept overnight.

After the reaction was finished, the reaction system was cooled to room temperature, and 20 mL water was added thereto. The resultant mixture solution was extracted with chloroform three times. The organic phases were combined and dried over anhydrous sodium sulfate. The desiccant was removed by filtration. The filtrate was concentrated, and then was separated by column chromatography with petroleum ether (boiling point: 60-90° C.) as the eluent to give 3.91 g of the intermediate 2 with a yield of 97%.

The structure of the intermediate 2 was characterized by NMR, mass spectrometry and elemental analysis. The result of mass spectrometry: 425.21 ([M+H]$^+$). The results of elemental analysis: C, 64.97; H, 8.81. The data of NMR characterization were as follows:

¹H NMR (400 MHz, CDCl₃) δ: 10.30 (s, 1H), 7.49 (d, J=8.8 Hz, 1H), 7.39 (d, J=3.2 Hz, 1H), 7.01 (dd, J₁=3.2 Hz, J₂=8.8 Hz, 1H), 3.85 (d, J=5.7 Hz, 2H), 1.80-1.74 (m, 1H), 1.45-1.37 (m, 4H), 1.27-1.26 (m, 20H), 0.89-0.85 (m, 6H).
¹³C NMR (100 MHz, CDCl₃) δ: 191.93, 159.24, 134.60, 134.09, 123.60, 117.75, 113.58, 71.66, 38.03, 32.08, 32.01, 31.47, 30.17, 29.83, 29.75, 29.50, 26.98, 22.85, 14.28.

1.2 Synthesis of the Intermediate 3

In a three-necked round-bottom flask, 3.91 g of the intermediate 2 was dissolved in 200 mL acetone, and then cooled to 0° C. in an ice bath. Then 100 mL Jones reagent was added to the reaction system, and then the mixture is heated to reflux, and the reaction is kept under stirring for 72 hours.

After the reaction was finished, the reaction system was cooled to room temperature, and 100 mL water was added thereto. The resultant mixture solution was extracted with chloroform three times. The organic phases were combined and dried over anhydrous sodium sulfate. The desiccant was removed by filtration. The filtrate was concentrated, and then was separated by column chromatography with chloroform as the eluent to give 2.93 g of the intermediate 3 with a yield of 72%.

The structure of the intermediate 3 was characterized by NMR, mass spectrometry and elemental analysis. The result of mass spectrometry: 440.20 ([M]⁺). The results of elemental analysis: C, 62.59.; H, 8.47. The data of NMR characterization were as follows:
¹H NMR (400 MHz, CDCl₃) δ: 7.53 (d, J=8.8 Hz, 1H), 7.50 (s, 1H), 6.91 (dd, J₁=8.8 Hz, J₂=2.5 Hz, 1H), 3.83 (d, J=5.6 Hz, 2H), 1.78-1.74 (m, 1H), 1.44-1.37 (m, 4H), 1.33-1.27 (m, 20H), 0.90-0.86 (m, 6H).
¹³C NMR (100 MHz, CDCl₃) δ: 158.59, 135.54, 120.71, 117.85, 112.61, 71.62, 38.08, 32.10, 32.03, 31.49, 30.19, 29.85, 29.77, 29.52, 27.02, 27.00, 22.87, 14.30.

1.3 Synthesis of the Intermediate 4

In a three-necked round-bottom flask, 2.93 g of the intermediate 3 was dissolved in 100 mL ethanol. Then 1 mL concentrated sulfuric acid was added to the reaction system, and then the mixture is heated to reflux, and the reaction is kept under stirring for 12 hours.

After the reaction was finished, the reaction system was cooled to room temperature, and 100 mL water was added thereto. The resultant mixture solution was extracted with chloroform three times. The organic phases were combined and dried over anhydrous sodium sulfate. The desiccant was removed by filtration. The filtrate was concentrated, and then was separated by column chromatography with chloroform as the eluent to give 2.97 g of the intermediate 4 with a yield of 95%.

The structure of the intermediate 4 was characterized by NMR, mass spectrometry and elemental analysis. The result of mass spectrometry: 469.21 ([M+H]⁺). The results of elemental analysis: C, 63.97; H, 8.81. The data of NMR characterization were as follows:
¹H NMR (400 MHz, CDCl₃) δ 7.48 (d, J=8.8 Hz, 1H), 7.28 (d, J=3.1 Hz, 1H), 6.85 (dd, J₁=8.8 Hz, J₂=3.12 Hz, 1H), 4.38 (q, J=7.2 Hz, 2H), 3.82 (d, J=5.6 Hz, 2H), 1.79-1.73 (m, 1H), 1.40-1.37 (m, 7H), 1.32-1.27 (m, 20H), 0.89-0.86 (m, 6H).
¹³C NMR (100 MHz, CDCl₃) δ 166.36, 188.54, 135.02, 133.33, 119.23, 117.09, 111.56, 71.49, 61.80, 38.06, 32.07, 32.00, 31.47, 30.15, 29.82, 29.73, 29.48, 26.99, 26.97, 22.83, 14.37, 14.26.

1.4 Synthesis of the Intermediate 5

In a dry Schlenk flask, 2.97 g of the intermediate 4, 2.09 g bis(pinacolato)diboron and 1.86 g potassium acetate were dissolved in 30 mL dimethylsulfoxide, and 238 mg Pd(dppf)Cl₂ as the catalyst was added under the protection of argon. The reaction system was heated to 45° C., and the reaction is kept overnight.

After the reaction was finished, the reaction system was cooled to room temperature, and 20 mL water was added thereto. The resultant mixture solution was extracted with chloroform three times. The organic phases were combined and dried over anhydrous sodium sulfate. The desiccant was removed by filtration. The filtrate was concentrated, and then was separated by column chromatography with ethyl acetate/petroleum ether (volume ratio: 1/20) as the eluent to give 3.01 g of the intermediate 5 with a yield of 92%.

The structure of the intermediate 5 was characterized by NMR, mass spectrometry and elemental analysis. The result of mass spectrometry: 516.39 ([M⁺]). The results of elemental analysis: C, 72.10.; H, 10.35. The data of NMR characterization were as follows:
¹H NMR (400 MHz, CDCl₃) δ: 7.42 (d, J=4.8 Hz, 1H), 7.40 (d, J=2.4 Hz, 1H), 7.02 (dd, J₁=8.2 Hz, J₂=2.2 Hz, 1H), 4.37 (m, J=7.2 Hz, 2H) 3.85 (d, J=5.7 Hz, 2H), 1.78-1.72 (m, 1H), 1.40-1.36 (m, 17H), 1.32-1.27 (m, 20H), 0.90-0.86 (m, 6H).
¹³C NMR (100 MHz, CDCl₃) δ: 162.32, 136.69, 114.18, 83.67, 71.03, 38.20, 32.11, 32.06, 31.67, 30.22, 29.89, 29.78, 29.52, 27.06, 25.07, 22.87, 14.27.

1.5 Synthesis of the Intermediate 7

In a three-necked round-bottom flask, 3.00 g of the intermediate 5, 3.30 g of the compound 6 and 6.16 g potassium phosphate were dissolved in a mixed solvent of 40 mL 1,4-dioxane and 8 mL water, and 26 mg catalyst Pd(OAc)₂ and 52 mg an organophosphine ligand 2-dicyclohexylphosphino-2',6'-dimethoxybiphenyl (Sphos) were added under the protection of argon. The reaction system was heated to 120° C., and the reaction is kept for 3 hours.

After the reaction was finished, the reaction system was cooled to room temperature, and 20 mL water was added thereto. The resultant mixture solution was extracted with chloroform three times. The organic phases were combined and dried over anhydrous sodium sulfate. The desiccant was removed by filtration. The filtrate was concentrated, and then was separated by column chromatography with ethyl acetate/petroleum ether (volume ratio: 1/20) as the eluent to give 4.24 g of the intermediate 7 with a yield of 83%.

The structure of the intermediate 7 was characterized by NMR, mass spectrometry and elemental analysis. The result of mass spectrometry: 878.64 ([M+H]⁺). The results of elemental analysis: C, 83.44; H, 9.53; N, 1.59. The data of NMR characterization were as follows:
¹H NMR (400 MHz, THF-d₈) δ: 8.70-8.66 (m, 2H), 8.09 (d, J=8.0 Hz, 1H), 7.92-7.87 (m, 2H), 7.77 (t, J=7.8 Hz, 1H), 7.71 (s, 1H), 7.69-7.63 (m, 2H), 7.57 (d, J=2.7 Hz, 1H), 7.49 (d, J=8.4 Hz, 1H), 7.24 (dd, J₁=8.4 Hz, J₂=2.8 Hz, 1H), 4.67 (d, J=7.44 Hz, 2H), 4.05 (d, J=5.4 Hz, 2H), 2.36-2.33 (m, 1H), 1.91-1.86 (m, 2H), 1.58-1.30 (m, 36H), 1.20 (br, 16H), 0.93-0.91 (m, 6H), 0.85-0.77 (m, 6H).
¹³C NMR (100 MHz, CDCl₃) δ: 168.27, 159.83, 138.28, 135.15, 135.03, 134.20, 133.26, 133.20, 131.58, 131.46, 130.13, 125.79, 125.42, 125.22, 124.76, 124.29, 121.57, 118.51, 117.51, 116.42, 114.82, 114.64, 71.89, 60.94, 50.71, 40.87, 39.30, 33.05, 32.90, 32.78, 32.59, 31.21, 31.02, 30.87, 30.77, 30.60, 30.50, 30.35, 28.02, 27.53, 27.45, 23.76, 23.64, 14.66, 13.74.

1.6 Synthesis of the Intermediate 8

In a three-necked round-bottom flask dried over flame, 4.00 g of the intermediate 7 was dissolved in 30 mL tetrahydrofuran. 9 mL p-hexylphenyl magnesium bromide solution (2M, in tetrahydrofuran) was added under the protection of argon. The reaction system was heated to 90° C., and the reaction is kept overnight.

After the reaction was finished, the reaction system was cooled to 0° C., and 20 mL water was added thereto. The resultant mixture solution was extracted with chloroform three times. The organic phases were combined and dried over anhydrous sodium sulfate. The desiccant was removed by filtration, and the filtrate was concentrated to give a brown viscous liquid, which was directly used in the next reaction step without being separated.

1.7 Synthesis of the Intermediate 9

In a dry three-necked round-bottom flask, the intermediate 8 obtained from the preceding step was dissolved in 30 mL toluene. 100 mg solid acid catalyst, Amberlyst 15, was added under the protection of argon, and the mixture was heated to reflux, and the reaction is kept overnight.

After the reaction was finished, the reaction system was cooled to room temperature, and 20 mL water was added thereto. The resultant mixture solution was extracted with chloroform three times. The organic phases were combined and dried over anhydrous sodium sulfate. The desiccant was removed by filtration. The filtrate was concentrated, and then was separated by column chromatography with petroleum ether (boiling point: 60-90° C.) as the eluent to give 2.07 g of the intermediate 9 with a yield of 40%.

The structure of the intermediate 9 was characterized by NMR, mass spectrometry and elemental analysis. The result of high resolution mass spectrometry: 1137.86377. The results of elemental analysis: C, 87.55; H, 9.81; N, 1.25. The data of NMR characterization were as follows:

$^1$H NMR (400 MHz, THF-d$_8$) δ: 9.05 (d, J=8.3 Hz, 1H), 8.83 (d, J=7.6 Hz, 1H), 8.74 (d, J=7.5 Hz, 1H), 8.45 (d, J=8.4 Hz, 1H), 8.07 (d, J=8.0 Hz, 1H), 7.96 (t, J=7.9 Hz, 1H), 7.83-7.76 (m, 3H), 7.52-7.50 (m, 4H), 7.06-7.04 (m, 5H), 6.97 (d, J=7.8 Hz, 1H), 4.19 (d, J=7.4 Hz, 2H), 3.84 (d, J=5.4 Hz, 2H), 2.56-2.45 (m, 4H), 2.08-2.03 (m, 1H), 1.58-1.55 (m, 4H), 1.48-1.46 (m, 1H), 1.35-1.30 (m, 36H), 1.18-1.11 (m, 10H), 1.04 (br, 10H), 0.89-0.81 (m, 16H), 0.76-0.66 (m, 6H).

$^{13}$C NMR (100 MHz, CDCl$_3$) δ: 158.41, 157.87, 141.65, 140.30, 139.49, 139.44, 134.42, 134.17, 132.65, 131.60, 131.11, 130.36, 129.53, 128.73, 128.58, 126.43, 126.05, 125.06, 124.71, 124.53, 123.37, 122.95, 122.67, 120.75, 120.58, 118.86, 117.83, 115.16, 112.79, 71.40, 63.86, 53.09, 38.34, 38.13, 35.75, 32.20, 32.13, 31.98, 31.59, 31.21, 31.11, 30.30, 30.11, 29.96, 29.88, 29.82, 29.72, 29.63, 29.50, 29.37, 27.19, 22.96, 27.84, 14.38, 14.31.

1.8 Synthesis of the Intermediate 10

In a dry Schlenk flask, 2.00 g of the intermediate 9 was dissolved in 20 mL tetrahydrofuran. The reaction system was cooled to 0° C. in an ice bath. 344 mg N-bromosuccinylimine was added to the reaction system, and the reaction is kept at 0° C. for 3 hours.

After the reaction was finished, 20 mL water was added to the reaction system. The resultant mixture solution was extracted with chloroform three times. The organic phases were combined and dried over anhydrous sodium sulfate. The desiccant was removed by filtration. The filtrate was concentrated, and then was separated by column chromatography with ethyl acetate/petroleum ether (volume ratio: 1/50) as the eluent to give 2.03 g of the intermediate 10 with a yield of 95%.

The structure of the intermediate 10 was characterized by NMR, mass spectrometry and elemental analysis. The result of mass spectrometry: 1216.79 ([M+H]$^+$). The results of elemental analysis: C, 81.88; H, 9.13; N, 1.16. The data of NMR characterization were as follows:

$^1$H NMR (400 MHz, THF-d$_8$) δ: 9.09 (d, J=8.4 Hz, 1H), 8.85-8.82 (m, 1H), 8.79-8.75 (m, 1H), 8.47 (d, J=8.7 Hz, 1H), 8.27-8.24 (m, 1H), 8.13 (s, 1H), 7.97 (t, J=7.8 Hz, 1H), 7.88-7.80 (m, 1H), 7.51 (d, J=8.2 Hz, 4H), 7.08-7.06 (m, 5H), 6.98 (dd, J$_1$=8.6 Hz, J$_2$=2.1 Hz, 1H), 4.20 (d, J=8.5 Hz, 2H), 3.84 (d, J=5.6 Hz, 2H), 2.55 (t, J=7.6 Hz, 4H), 2.07-2.02 (m, 2H), 1.61-1.53 (m, 4H), 1.44-1.30 (m, 36H), 1.21-1.04 (m, 20H), 0.91-0.76 (m, 22H).

$^{13}$C NMR (100 MHz, THF-d$_8$) δ: 159.75, 158.90, 142.56, 141.08, 140.34, 140.26, 134.59, 133.31, 132.76, 131.51, 131.42, 130.35, 129.36, 129.35, 128.75, 127.33, 126.52, 126.46, 126.22, 126.48, 125.15, 124.12, 123.95, 122.30, 122.20, 119.88, 119.09, 118.15, 117.84, 113.69, 113.30, 71.89, 64.77, 53.83, 39.40, 39.00, 36.50, 33.05, 32.99, 32.86, 32.61, 32.48, 32.02, 31.89, 31.18, 30.94, 30.83, 30.67, 30.48, 30.38, 30.27, 28.06, 28.01, 27.93, 27.91, 23.74, 23.68, 23.66, 14.66, 14.64, 14.62, 14.60.

1.9 Synthesis of the Intermediate 12

In a dry Schlenk flask, 2.00 g of the intermediate 10, 641 mg of the compound 11 and 590 mg cesium carbonate were dissolved in 10 mL 1,4-dioxane. 46 mg catalyst Pd$_2$(dba)$_3$ and 23 mg organophosphine ligand P(t-Bu)$_3$ were added in a glove box filled with nitrogen. The reaction system was heated to 120° C., and the reaction is kept overnight.

After the reaction was finished, the reaction system was cooled to room temperature, and 20 mL water was added thereto. The resultant mixture solution was extracted with chloroform three times. The organic phases were combined and dried over anhydrous sodium sulfate. The desiccant was removed by filtration. The filtrate was concentrated, and then was separated by column chromatography with toluene/petroleum ether (volume ratio: 1/2) as the eluent to give 1.96 g of the intermediate 12 with a yield of 81%.

The structure of the intermediate 12 was characterized by NMR, mass spectrometry and elemental analysis. The result of mass spectrometry: 1473.95 ([M+H]$^+$). The results of elemental analysis: C, 83.16; H, 8.54; N, 2.86. The data of NMR characterization were as follows:

$^1$H NMR (400 MHz, THF-d$_8$) δ: 8.97 (d, J=8.2 Hz, 1H), 8.78 (d, J=8.0 Hz, 1H), 8.74-8.70 (m, 2H), 8.42 (d, J=8.6 Hz, 1H), 8.16-8.13 (m, 4H), 8.08 (s, 1H), 7.89-7.86 (m, 2H), 7.82-7.77 (m, 2H), 7.63 (d, J=7.6 Hz, 4H), 7.16-7.12 (m, 5H), 6.95 (d, J=8.0 Hz, 1H), 4.34-4.29 (m, 4H), 3.85 (d, J=4.5 Hz, 2H), 2.60-2.57 (m, 4H), 2.12 (br, 2H), 1.77-1.74 (m, 4H), 1.60-1.58 (m, 4H), 1.53-1.47 (m, 4H), 1.35-1.30 (m, 36H), 1.18-1.09 (m, 16H), 1.02-0.98 (m, 4H), 0.90-0.87 (m, 12H), 0.81-0.72 (m, 9H).

$^{13}$C NMR (100 MHz, THF-d$_8$) δ: 166.44, 159.80, 159.07, 156.59, 154.02, 142.61, 142.24, 140.78, 140.42, 140.33, 136.91, 134.55, 134.00, 133.04, 132.72, 132.43, 131.69, 131.35, 131.26, 130.45, 130.41, 130.08, 129.43, 129.25, 127.32, 126.65, 126.48, 126.13, 125.35, 124.71, 124.10, 123.88, 122.13, 122.02, 120.73, 120.29, 118.59, 118.52, 116.55, 113.63, 113.38, 98.61, 91.10, 71.91, 65.43, 64.81, 53.88, 39.38, 39.27, 36.54, 33.04, 33.00, 32.90, 32.86, 32.61, 32.48, 32.14, 32.00, 31.18, 31.09, 30.80, 30.75, 30.62, 30.41, 30.29, 28.06, 28.03, 23.74, 23.66, 20.35, 14.70, 14.65, 14.38.

1.10 Synthesis of the Target Product of Formula (I-a-e)

In a three-necked round-bottom flask, 1.96 g of the intermediate 12 was dissolved in a mixed solvent of 15 mL tetrahydrofuran and 5 mL water. 745 mg potassium hydroxide was added to the reaction system, and then the mixture is heated to 80° C., and the reaction is kept under stirring for 5 hours.

After the reaction was finished, the reaction system was cooled to room temperature, and 20 mL aqueous phosphoric acid solution (0.2 mol/L) was added. The resultant mixture solution was extracted with chloroform three times. The organic phases were combined and dried over anhydrous sodium sulfate. The desiccant was removed by filtration. The filtrate was concentrated, and then was separated by column chromatography with trichloromethane/methanol (volume ratio: 1/20) as the eluent to give 1.89 g of the target product of formula (I-a-e) with a yield of 99%.

The structure of the target product of formula (I-a-e) was characterized by NMR, mass spectrometry and elemental analysis. The data of NMR characterization were as follows:

$^1$H NMR (400 MHz, THF-d$_8$) δ: 9.10 (d, J=8.4 Hz, 1H), 8.96-8.88 (m, 3H), 8.49 (d, J=8.7 Hz, 1H), 8.23-8.17 (m, 5H), 8.06-7.98 (m, 4H), 7.52 (d, J=8.2 Hz, 4H), 7.09-7.07 (m, 5H), 6.98 (d, J=8.6 Hz, 1H), 4.25 (d, J=8.1 Hz, 2H), 3.86 (d, J=5.3 Hz, 2H), 2.56 (t, J=7.6 Hz, 4H), 2.13-2.01 (m, 2H), 1.60-1.54 (m, 4H), 1.49-1.45 (m, 2H), 1.36-1.30 (m, 36H), 1.17-1.05 (m, 16H), 0.90-0.87 (m, 14H), 0.81-0.69 (m, 10H).

$^{13}$C NMR (100 MHz, THF-d$_8$) δ: 167.62, 159.85, 159.09, 156.79, 154.18, 142.61, 142.18, 140.86, 140.36, 140.26, 136.96, 134.53, 134.03, 133.53, 132.76, 132.64, 131.79, 131.75, 131.47, 130.77, 130.60, 130.40, 130.12. 129.42, 129.40, 129.36, 127.37, 126.69, 126.56, 126.24, 125.40, 124.82, 124.10, 124.00, 122.23, 122.13, 120.77, 120.46, 118.57, 118.48, 116.56, 113.69, 113.32, 98.48, 91.07, 71.92, 64.80, 53.83, 39.40, 39.26, 36.53, 33.05, 33.00, 32.90, 32.87, 32.64, 32.62, 32.49, 32.15, 32.00, 31.18, 31.06, 30.83, 30.80, 30.78, 30.74, 30.61, 30.48, 30.40, 30.29, 28.06, 28.02, 23.74, 23.66, 14.65, 14.61.

The result of high resolution mass spectrometry: 1416.88382. The results of elemental analysis: C, 83.07; H, 8.33; N, 2.95. The experimental results show that an organic dye having the structure of formula (I-a-e) was prepared in the present invention.

Example 2

The reaction scheme is shown as follows:

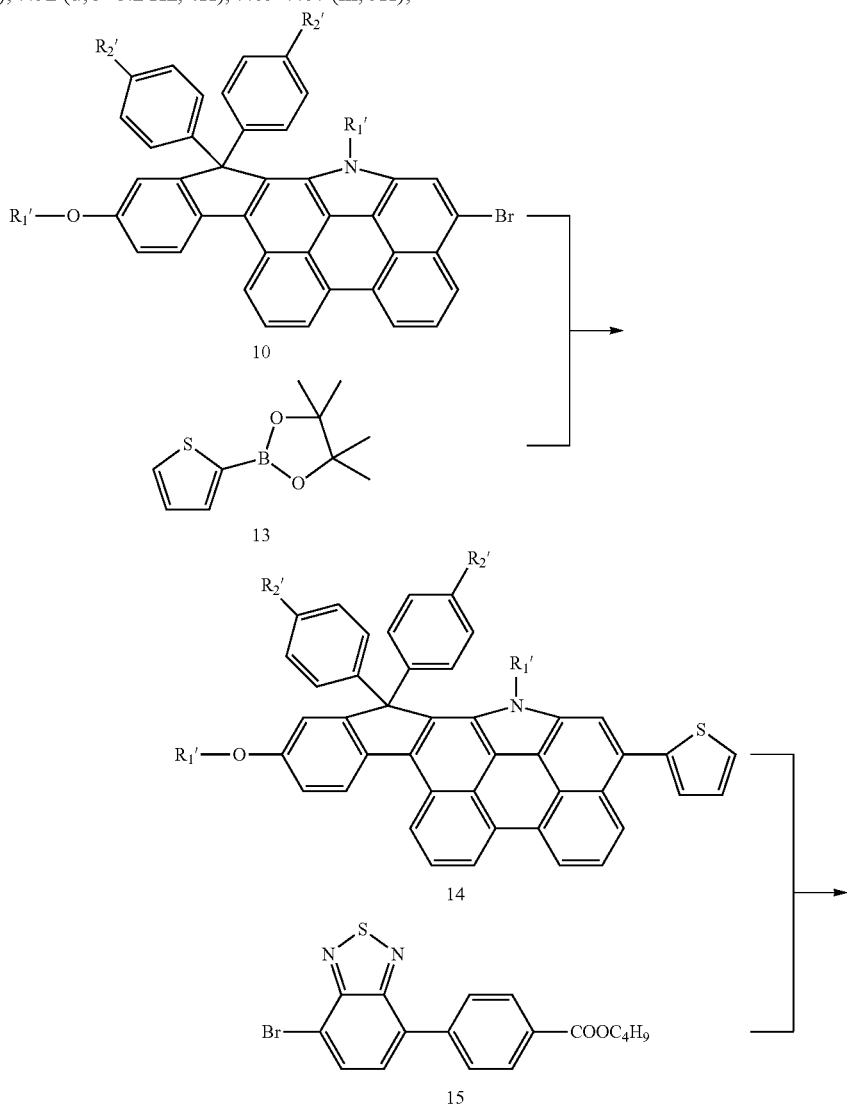

-continued

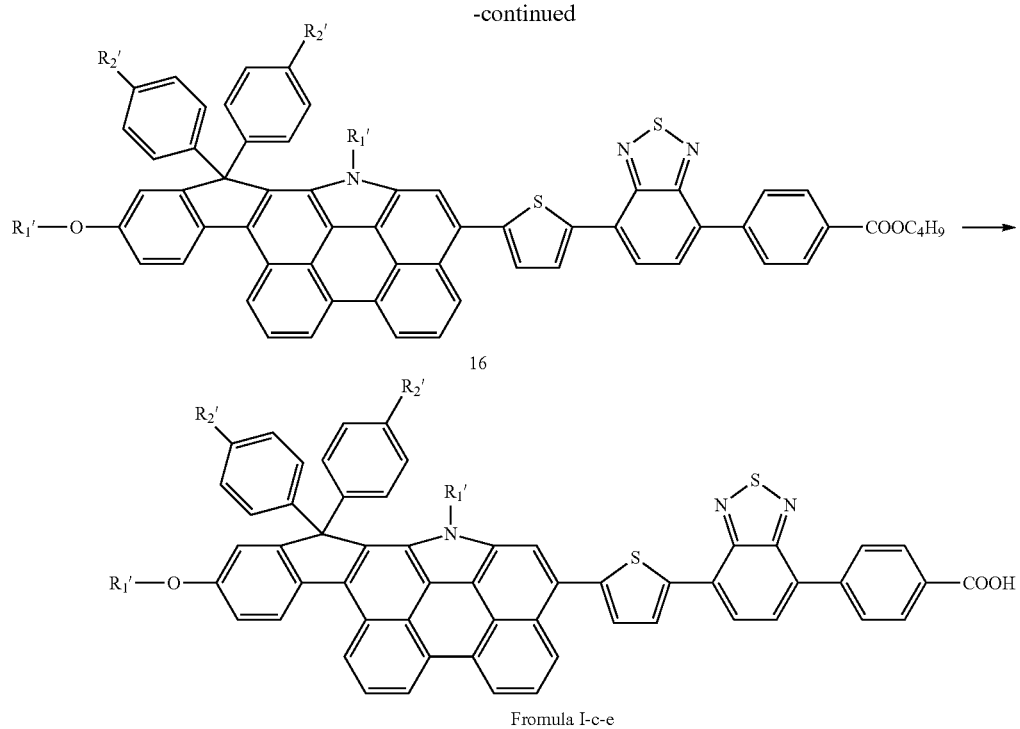

Fromula I-c-e

2.1 Synthesis of the Intermediate 14

In a three-necked round-bottom flask, 1.00 g of the intermediate 10 from Example 1, 184 mg of the compound 13 and 871 mg potassium phosphate were dissolved in a mixed solvent of 20 mL 1,4-dioxane and 4 mL water. 4 mg Pd(OAc)$_2$ as the catalyst and 8 mg 2-dicyclohexylphosphino-2',6'-dimethoxybiphenyl (Sphos) as the organophosphine ligand were added under the protection of argon. The reaction system was heated to 45° C., and the reaction is kept for 12 hours.

After the reaction was finished, the reaction system was cooled to room temperature, and 20 mL water was added thereto. The resultant mixture solution was extracted with chloroform three times. The organic phases were combined and dried over anhydrous sodium sulfate. The desiccant was removed by filtration. The filtrate was concentrated, and then was separated by column chromatography with ethyl acetate/petroleum ether (volume ratio: 1/50) as the eluent to give 832 mg of the intermediate 14 with a yield of 83%.

The structure of the intermediate 14 was characterized by NMR, mass spectrometry and elemental analysis. The result of mass spectrometry: 1220.85 ([M+H]$^+$). The results of elemental analysis: C, 85.61; H, 9.31; N, 1.18. The data of NMR characterization were as follows:

$^1$H NMR (400 MHz, THF-d$_8$) δ: 9.06 (d, J=8.4 Hz, 1H), 8.81 (d, J=7.1 Hz, 1H), 8.74 (d, J=7.1 Hz, 1H), 8.60 (d, J=8.3 Hz, 1H), 8.48 (d, J=8.6 Hz, 1H), 8.12 (s, 1H), 7.95 (t, J=7.7 Hz, 1H), 7.81 (t, J=7.7 Hz, 1H), 7.71 (s, 1H), 7.57 (d, J=7.6 Hz, 4H), 7.10-7.08 (m, 5H), 6.98 (d, J=8.5 Hz, 1H), 6.89 (d, J=3.1 Hz, 1H), 6.63 (br, 1H), 4.27 (d, J=7.8 Hz, 2H), 3.84 (d, J=5.2 Hz, 2H), 2.56 (t, J=7.4 Hz, 4H), 2.16-2.14 (m, 1H), 1.73-1.70 (m, 1H), 1.60-1.55 (m, 4H), 1.48-1.45 (m, 2H), 1.30 (br, 36H), 1.21-1.08 (m, 18H), 0.92-0.83 (m, 16H), 0.81-0.76 (m, 6H).

$^{13}$C NMR (100 MHz, CDCl$_3$) δ: 159.62, 158.87, 144.64, 142.47, 141.02, 140.47, 140.41, 135.87, 134.76, 133.11, 132.84, 131.99, 131.55, 130.39, 129.74, 129.34, 128.83, 128.31, 127.85, 127.33, 126.75, 126.12, 125.91, 125.50, 124.95, 123.87, 123.75, 121.88, 119.61, 118.49, 117.75, 113.60, 113.38, 71.87, 64.77, 53.78, 39.38, 38.89, 36.51, 33.04, 32.98, 32.86, 32.59, 32.49, 32.05, 31.94, 31.17, 30.92, 30.82, 30.73, 30.63, 30.58, 30.48, 30.37, 30.25, 28.06, 28.00, 23.74, 23.66, 14.71, 14.67.

2.2 Synthesis of the Intermediate 16

In a three-necked round-bottom flask dried over flame, 800 mg of the intermediate 14 was dissolved in 20 mL anhydrous tetrahydrofuran and cooled to −78° C. 0.45 mL t-butyl lithium (1.6 mol/L, in n-hexane) was added under the protection of argon, and stirred for 1 h at this low temperature. Then 144 mg trimethyl tin chloride was added, the mixture is heated to room temperature, and the reaction is kept overnight.

After the reaction was finished, 20 mL water was added to the reaction system. The resultant mixture solution was extracted with chloroform three times. The organic phases were combined and dried over anhydrous sodium sulfate. The desiccant was removed by filtration, and the filtrate was concentrated to give a viscous liquid, which was sufficiently dried and then dissolved in 20 mL toluene. 514 mg of the compound 15 and 55 mg Pd(PPh$_3$)$_2$Cl$_2$ as the catalyst were added under the protection of argon. The reaction system was heated to reflux, and the reaction is kept overnight.

After the reaction was finished, the reaction system was cooled to room temperature, and 20 mL water was added thereto. The resultant mixture solution was extracted with chloroform three times. The organic phases were combined and dried over anhydrous sodium sulfate. The desiccant was removed by filtration. The filtrate was concentrated, and then was separated by column chromatography with ethyl acetate/petroleum ether (volume ratio: 1/20) as the eluent to give 622 mg of the intermediate 16 with a yield of 62%.

The structure of the intermediate 16 was characterized by NMR, mass spectrometry and elemental analysis. The result of mass spectrometry: 1531.93 ([M+H]$^+$). The results of elemental analysis: C, 81.52; H, 8.34; N, 2.78. The data of NMR characterization were as follows:

$^1$H NMR (400 MHz, THF-d$_8$) δ: 9.06 (d, J=8.4 Hz, 1H), 8.77 (d, J=7.7 Hz, 2H), 8.73 (d, J=7.6 Hz, 1H), 8.54 (d, J=8.2 Hz, 1H), 8.49 (d, J=8.6 Hz, 1H), 8.23 (d, J=3.6 Hz, 1H), 8.11-8.09 (m, 4H), 8.03 (s, 1H), 7.92 (t, J=7.8 Hz, 1H), 7.86 (d, J=7.5 Hz, 1H), 7.81 (t, J=5.7 Hz, 1H), 7.70 (d, J=7.5 Hz, 1H), 7.59 (d, J=8.0 Hz, 4H), 7.46 (d, J=3.6 Hz, 1H), 7.11-7.09 (m, 5H), 6.99 (d, J=8.2 Hz, 1H), 4.35-4.30 (m, 4H), 3.86 (d, J=5.0 Hz, 2H), 2.58-2.54 (m, 4H), 2.18 (br, 2H), 1.78-1.74 (m, 4H), 1.59-1.56 (m, 4H), 1.54-1.48 (m, 4H), 1.35-1.30 (m, 34H), 1.15-1.08 (m, 16H), 1.02-0.98 (m, 4H), 0.90-0.86 (m, 10H), 0.79-0.73 (m, 12H).

$^{13}$C NMR (100 MHz, CDCl$_3$) δ: 166.49, 159.70, 158.92, 154.75, 153.65, 146.82, 142.54, 142.41, 141.03, 140.47, 140.43, 139.71, 136.09, 134.73, 133.17, 133.06, 131.89, 131.74, 131.61, 131.08, 130.41, 130.01, 129.70 129.61, 129.38, 128.84, 128.47, 128.09, 127.29, 126.66, 126.15, 126.07, 125.82, 125.57, 124.92, 123.96, 123.80, 121.96, 119.85, 118.51, 117.60, 113.66, 113.40, 71.92, 65.40, 64.83, 53.88, 39.40, 39.00, 36.52, 33.04, 32.99, 32.85, 32.59, 32.49, 32.07, 32.01, 31.17, 30.99, 30.82, 30.74, 30.68, 30.62, 30.48, 30.40, 30.26, 28.06, 28.01, 23.74, 23.65, 20.35, 14.68, 14.63, 14.36.

2.3 Synthesis of the Target Product of Formula (I-c-e)

In a three-necked round-bottom flask, 600 mg of the intermediate 16 was dissolved in a mixed solvent of 15 mL tetrahydrofuran and 5 mL water. 219 mg potassium hydroxide was added to the reaction system, then the mixture is heated to 80° C., and the reaction is kept under stirring for 5 hours.

After the reaction was finished, the reaction system was cooled to room temperature, and 20 mL aqueous phosphoric acid solution (0.2 mol/L) was added. The resultant mixture solution was extracted with chloroform three times. The organic phases were combined and dried over anhydrous sodium sulfate. The desiccant was removed by filtration. The filtrate was concentrated, and then was separated by column chromatography with trichloromethane/methanol (volume ratio: 1/20) as the eluent to give 572 mg of the target product of formula (I-c-e) with a yield of 99%.

The structure of the target product of formula (I-c-e) was characterized by NMR, mass spectrometry and elemental analysis. The data of NMR characterization were as follows:

$^1$H NMR (400 MHz, THF-d$_8$) δ: 9.05 (d, J=8.4 Hz, 1H), 8.77 (d, J=7.6 Hz, 1H), 8.73 (d, J=7.6 Hz, 1H), 8.54 (d, J=8.2 Hz, 1H), 8.48 (d, J=8.6 Hz, 1H), 8.24 (d, J=3.6 Hz, 1H), 8.17 (d, J=8.3 Hz, 2H), 8.11 (d, J=8.3 Hz, 2H), 8.03 (s, 1H), 7.94-7.88 (m, 2H), 7.81 (t, J=7.8 Hz, 1H), 7.74 (d, J=7.5 Hz, 1H), 7.59 (d, J=8.0 Hz, 4H), 7.47 (d, J=3.5 Hz, 1H), 7.11-7.09 (m, 5H), 6.99 (d, J=7.6 Hz, 1H), 4.30 (d, J=7.1 Hz, 2H), 3.85 (d, J=4.9 Hz, 2H), 2.55 (t, J=7.4 Hz, 4H), 2.17-2.14 (m, 1H), 1.74-1.72 (m, 2H), 1.59-1.54 (m, 4H), 1.4-1.42 (m, 2H), 1.30 (br, 36H), 1.09-1.07 (m, 18H), 0.90-0.85 (m, 12H), 0.78-0.72 (m, 9H).

$^{13}$C NMR (100 MHz, THF-d$_8$) δ: 167.75, 159.68, 158.91, 154.77, 153.67, 146.76, 142.53, 142.23, 141.01, 140.46, 140.41, 139.74, 136.07, 134.72, 133.17, 133.04, 131.91, 131.60, 131.51, 130.74, 130.41, 129.96, 129.59, 129.38, 128.83, 128.47, 128.01, 127.29, 126.66, 126.15, 126.07, 125.86, 125.56, 124.92, 123.96, 123.80, 121.97, 119.84, 118.51, 117.59, 113.63, 113.39, 71.88, 64.81, 53.86, 39.38, 38.99, 36.51, 33.04, 32.99, 32.85, 32.60, 32.47, 32.06, 31.97, 31.17, 30.98, 30.82, 30.67, 30.62, 30.40, 30.27, 28.19, 28.00, 23.74, 23.65, 14.69, 14.64.

The result of high resolution mass spectrometry: 1474.87358. The results of elemental analysis: C, 81.43; H, 8.16; N, 2.83. The experimental results show that an organic dye having the structure of formula (I-c-e) was prepared in the present invention.

Example 3

The reaction scheme is shown as follows:

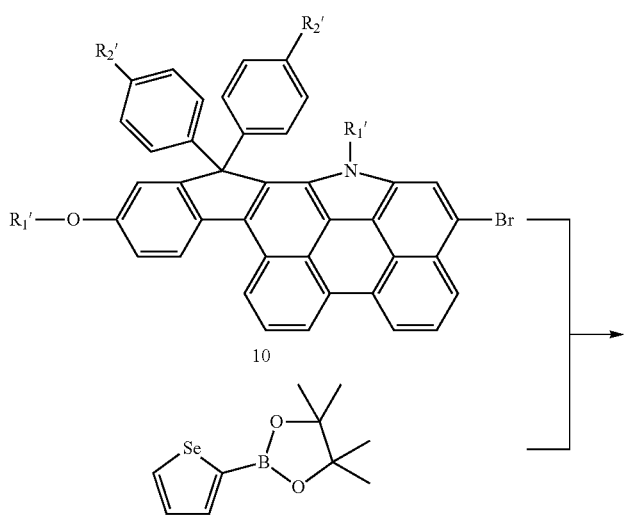

-continued

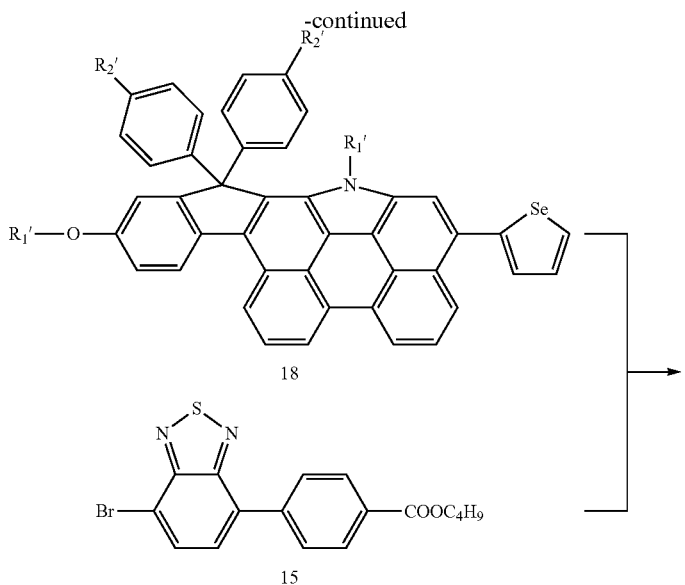
18

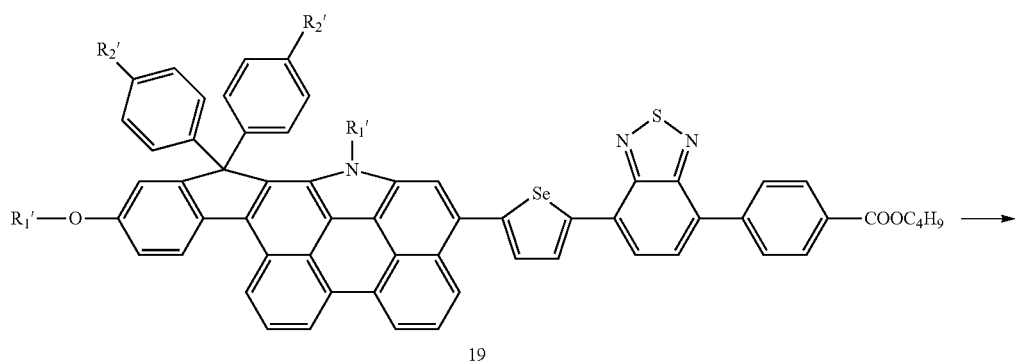
19

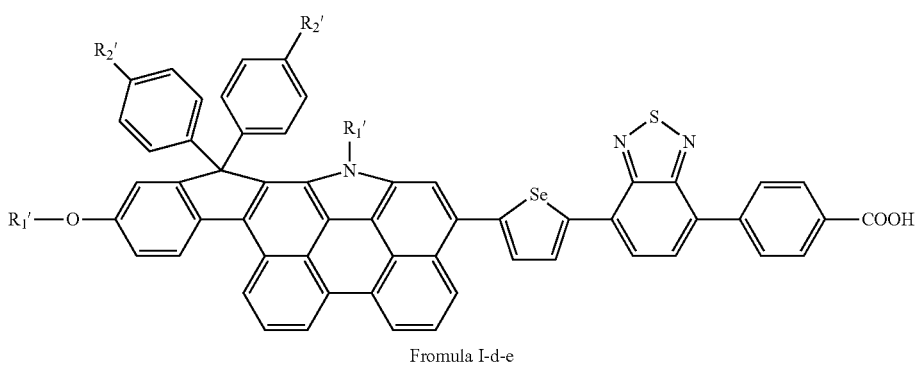
Fromula I-d-e

3.1 Synthesis of the Intermediate 18

In a three-necked round-bottom flask, 1.00 g of the intermediate 10 from Example 1, 399 mg of the compound 17 and 871 mg potassium phosphate were dissolved in a mixed solvent of 20 mL 1,4-dioxane and 4 mL water. 4 mg Pd(OAc)$_2$ as the catalyst and 8 mg 2-dicyclohexylphosphino-2',6'-dimethoxybiphenyl (Sphos) as the organophosphine ligand were added under the protection of argon. The reaction system was heated to reflux, and the reaction is kept for 12 hours.

After the reaction was finished, the reaction system was cooled to room temperature, and 20 mL water was added thereto. The resultant mixture solution was extracted with chloroform three times. The organic phases were combined and dried over anhydrous sodium sulfate. The desiccant was removed by filtration. The filtrate was concentrated, and then was separated by column chromatography with ethyl acetate/ petroleum ether (volume ratio: 1/50) as the eluent to give 864 mg of the intermediate 18 with a yield of 83%.

The structure of the intermediate 18 was characterized by NMR, mass spectrometry and elemental analysis. The result of mass spectrometry: 1268.81 ([M+H]$^+$). The results of elemental analysis: C, 82.43; H, 8.92; N, 1.12. The data of NMR characterization were as follows:

$^1$H NMR (400 MHz, THF-d$_8$) δ: 9.07 (d, J=8.4 Hz, 1H), 8.86-8.78 (m, 2H), 8.48 (d, J=8.6 Hz, 1H), 8.43 (d, J=8.2 Hz, 1H), 8.18-8.16 (m, 1H), 7.99-7.93 (m, 2H), 7.82-7.78 (m, 1H), 7.56-7.53 (m, 5H), 7.45-7.42 (m, 1H), 7.09-7.07 (m, 5H), 6.98 (dd, J,=8.5 Hz, J$_2$=1.7 Hz, 1H), 4.24-4.23 (m, 2H), 3.85 (d, J=5.0 Hz, 2H), 2.55 (t, J=7.5 Hz, 4H), 2.13 (br, 1H), 1.71 (m, 1H), 1.59-1.56 (m, 4H), 1.48-1.45 (m, 2H), 1.55-1.30 (m, 36H), 1.17-1.06 (m, 18H), 0.90-0.80 (m, 16H), 0.78-0.75 (m, 6H).

$^{13}$C NMR (100 MHz, CDCl$_3$) δ: 159.64, 158.87, 150.84, 142.48, 141.06, 140.46, 140.40, 135.84, 134.75, 133.11, 132.82, 131.93, 131.50, 130.73, 130.30, 130.01, 129.33, 128.63, 127.35, 126.73, 126.12, 125.86, 125.47, 125.10, 123.85, 123.74, 121.89, 119.56, 118.50, 117.73, 113.64, 113.35, 71.89, 64.76, 53.76, 39.40, 38.88, 36.50, 32.99, 32.85, 32.61, 32.50, 32.05, 31.94, 31.17, 30.91, 30.83, 30.73, 30.58, 30.48, 30.37, 30.26, 28.00, 23.73, 23.65, 14.63.

3.2 Synthesis of the Intermediate 19

In a three-necked round-bottom flask dried over flame, 840 mg of the intermediate 18 was dissolved in 20 mL anhydrous tetrahydrofuran and then cooled to −78° C. 0.45 mL t-butyl lithium (1.6 mol/L, in n-hexane) was added under the protection of argon, and stirred for 1 h at this low temperature. Then 144 mg trimethyl tin chloride was added, the mixture is heated to room temperature, and the reaction is kept overnight.

After the reaction was finished, 20 mL water was added to the reaction system. The resultant mixture solution was extracted with chloroform three times. The organic phases were combined and dried over anhydrous sodium sulfate. The desiccant was removed by filtration, and the filtrate was concentrated to give a viscous liquid, which was sufficiently dried and then dissolved in 20 mL toluene. 514 mg of the compound 15 and 55 mg Pd(PPh$_3$)$_2$Cl$_2$ as the catalyst were added under the protection of argon. The reaction system was heated to reflux, and the reaction is kept overnight.

After the reaction was finished, the reaction system was cooled to room temperature, and 20 mL water was added thereto. The resultant mixture solution was extracted with chloroform three times. The organic phases were combined and dried over anhydrous sodium sulfate. The desiccant was removed by filtration. The filtrate was concentrated, and then was separated by column chromatography with ethyl acetate/petroleum ether (volume ratio: 1/20) as the eluent to give 654 mg of the intermediate 19 with a yield of 62%.

The structure of the intermediate 19 was characterized by NMR, mass spectrometry and elemental analysis. The result of mass spectrometry: 1579.86 ([M+H]$^+$). The results of elemental analysis: C, 79.20; H, 8.08; N, 2.64. The data of NMR characterization were as follows:

$^1$H NMR (400 MHz, THF-d$_8$) δ: 9.07 (d, J=8.5 Hz, 1H), 8.83-8.77 (m, 2H), 8.58 (d, J=8.3 Hz, 1H), 8.50-8.48 (m, 1H), 8.40-8.29 (m, 1H), 8.17-8.13 (m, 4H), 8.02-7.94 (m, 3H), 7.88-7.78 (m, 2H), 7.63-7.62 (m, 1H), 7.58-7.56 (m, 4H), 7.10-7.08 (m, 5H), 7.01-6.99 (m, 1H), 4.34 (t, J=6.6 Hz, 2H), 4.30-4.28 (m, 2H), 3.86 (d, J=4.9 Hz, 2H), 2.57-2.50 (m, 4H), 2.17-2.15 (m, 2H), 1.81-1.77 (m, 4H), 1.58-1.47 (m, 8H), 1.35-1.29 (m, 36H), 1.14-0.99 (m, 20H), 0.90-0.84 (m, 12H), 0.79-0.73 (m, 9H).

$^{13}$C NMR (100 MHz, CDCl$_3$) δ: 166.52, 159.70, 158.93, 154.61, 153.87, 144.58, 144.53, 142.55, 142.47, 141.07, 140.47, 140.42, 136.02, 134.75, 133.26, 133.22, 133.02, 131.98, 131.89, 131.62, 131.59, 131.11, 130.64, 130.45, 130.33, 130.03, 129.87, 129.78, 129.37, 128.29, 127.34, 126.69, 126.18, 126.03, 125.62, 125.15, 123.94, 123.89, 123.81, 122.01, 121.98, 119.78, 118.56, 117.49, 113.67, 113.39, 71.91, 65.42, 64.82, 53.84, 39.41, 38.97, 36.52, 33.06, 33.01, 32.91, 32.87, 32.63, 32.50, 32.07, 32.03, 31.19, 30.99, 30.84, 30.82, 30.75, 30.68, 30.64, 30.50, 30.42, 30.28, 28.08, 28.02, 23.75, 23.67, 20.37, 14.68, 14.64, 14.36.

3.3 Synthesis of the Target Product of Formula (I-d-e)

In a three-necked round-bottom flask, 630 mg of the intermediate 19 was dissolved in a mixed solvent of 15 mL tetrahydrofuran and 5 mL water. 219 mg potassium hydroxide was added to the reaction system, then the mixture is heated to 80° C., and the reaction is kept under stirring for 5 hours.

After the reaction was finished, the reaction system was cooled to room temperature, and 20 mL aqueous phosphoric acid solution (0.2 mol/L) was added. The resultant mixture solution was extracted with chloroform three times. The organic phases were combined and dried over anhydrous sodium sulfate. The desiccant was removed by filtration. The filtrate was concentrated, and then was separated by column chromatography with trichloromethane/methanol (volume ratio: 1/20) as the eluent to give 595 mg of the target product of formula (I-d-e) with a yield of 99%.

The structure of the target product of formula (I-d-e) was characterized by NMR, mass spectrometry and elemental analysis. The data of NMR characterization were as follows:

$^1$H NMR (400 MHz, THF-d$_8$) δ: 9.09 (d, J=8.4 Hz, 1H), 8.90 (d, J=7.7 Hz, 1H), 8.86 (d, J=7.6 Hz, 1H), 8.61 (d, J=8.3 Hz, 1H), 8.48 (d, J=8.7 Hz, 1H), 8.45 (d, J=4.0 Hz, 1H), 8.24-8.16 (m, 5H), 8.04-7.99 (m, 3H), 7.89 (t, J=8.0 Hz, 1H), 7.70 (d. J=4.0 Hz, 1H), 7.52 (d, J=8.3 Hz, 4H), 7.09-7.06 (m, 5H), 6.99 (dd, J$_1$=8.6 Hz, J$_2$=2.2 Hz, 1H), 4.24 (d, J=8.2 Hz, 2H), 3.86 (d, J=5.6 Hz, 2H), 2.55 (t, J=7.6 Hz, 4H), 2.18-2.03 (m, 2H), 1.58-154 (m, 4H), 1.49-1.46 (m, 3H), 1.36-1.30 (m, 36H), 1.15-1.06 (m, 18H), 0.91-0.84 (m, 12H), 0.78-0.72 (m, 9H).

$^{13}$C NMR (100 MHz, THF-d$_8$) δ: 167.63, 159.69, 158.92, 154.66, 154.55, 153.92, 144.61, 142.53, 142.31, 141.07, 140.45, 140.40, 136.01, 134.74, 133.24, 133.01, 131.99, 131.88, 131.59, 131.52, 130.76, 130.64, 130.29, 129.97, 129.78, 129.36, 128.31, 127.34, 126.70, 126.18, 126.02, 125.62, 125.22, 125.13, 123.91, 123.$0, 122.01, 119.77, 118.54, 117.50, 113.66, 113.36, 71.91, 64.80, 53.81, 39.41, 38.96, 36.51, 33.05, 33.00, 32.90, 32.87, 32.62, 32.49, 32.07, 31.97, 31.38, 30.98, 30.83, 30.74, 30.67, 30.62, 30.48, 30.45, 30.28, 28.07, 28.02, 23.74, 23.66, 14.66, 14.62.

The result of high resolution mass spectrometry: 1522.81882. The results of elemental analysis: C, 78.95; H, 7.89; N, 2.74. The experimental results show that an organic dye having the structure of formula (I-d-e) was prepared in the present invention.

Example 4
The reaction scheme is shown as follows:
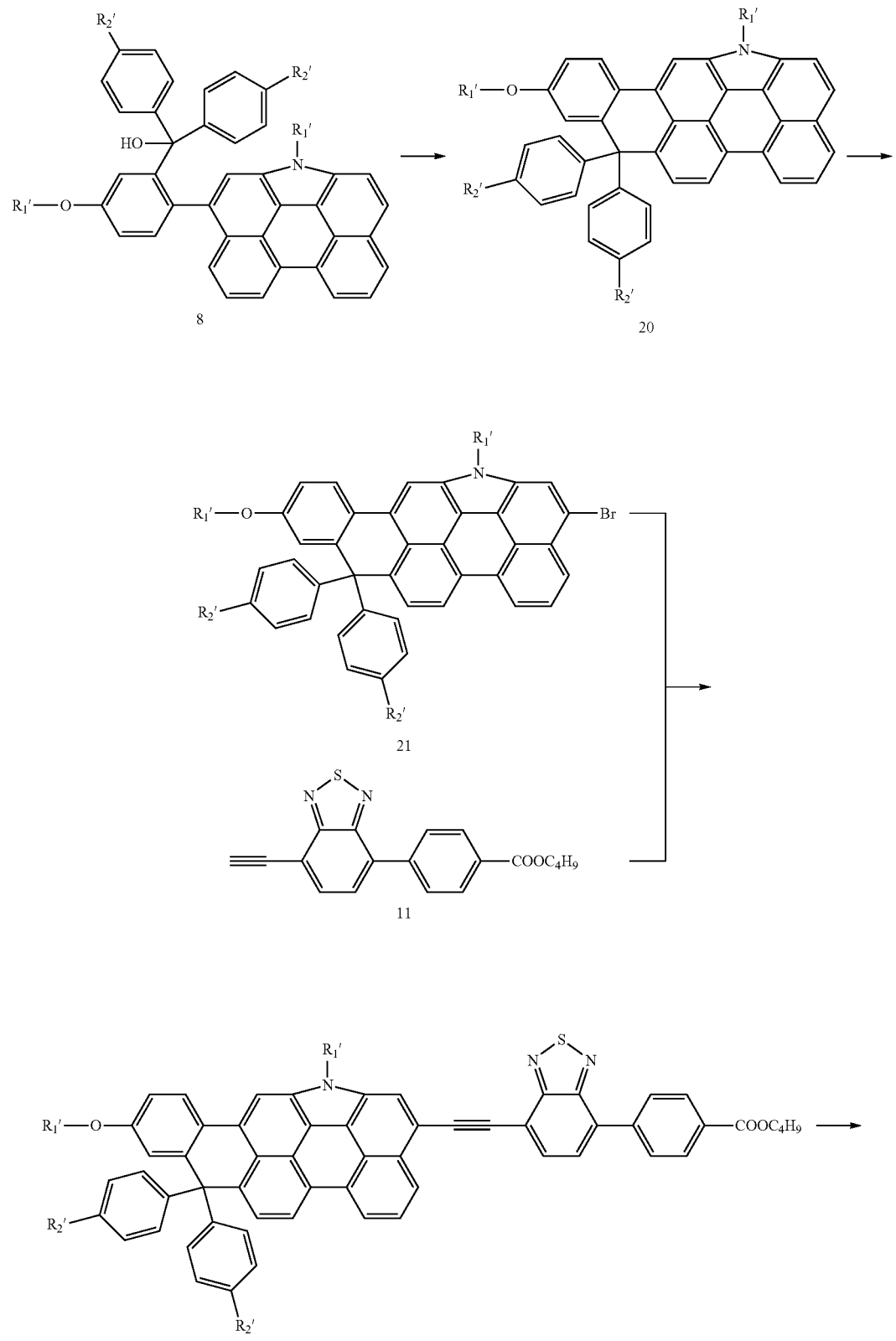

-continued

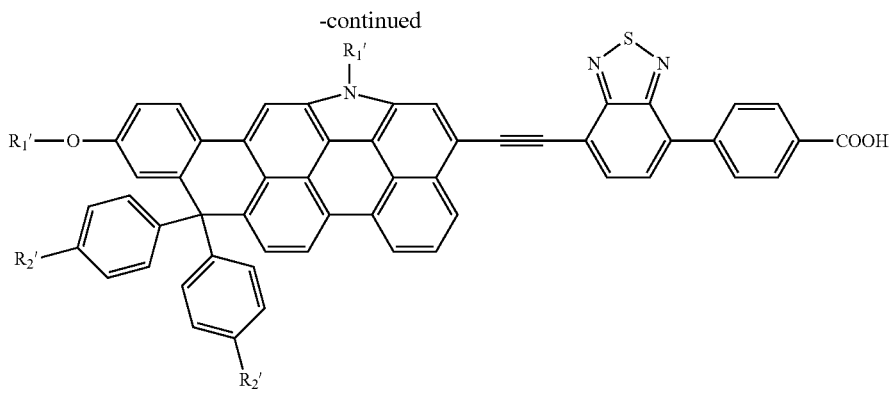

Formula II-a-e

4.1 Synthesis of the Intermediate 20

In a dry three-necked round-bottom flask, the intermediate 8 from Example 1 was dissolved in 30 mL toluene. 100 mg solid acid catalyst, Amberlyst 15, was added under the protection of argon, the mixture is heated to reflux, and the reaction is kept overnight.

After the reaction was finished, the reaction system was cooled to room temperature, and 20 mL water was added thereto. The resultant mixture solution was extracted with chloroform three times. The organic phases were combined and dried over anhydrous sodium sulfate. The desiccant was removed by filtration. The filtrate was concentrated, and then was separated by column chromatography with petroleum ether (boiling point: 60-90° C.) as the eluent to give 2.85 g of the intermediate 20 with a yield of 55%.

The structure of the intermediate 20 was characterized by NMR, mass spectrometry and elemental analysis. The result of high resolution mass spectrometry: 1137.86429. The results of elemental analysis: C, 87.56; H, 9.82; N, 1.26. The data of NMR characterization were as follows:

$^1$H NMR (400 MHz, THF-d$_8$) δ: 8.58-8.56 (m, 2H), 8.37 (s, 1H), 8.24 (d, J=8.9 Hz, 1H), 8.00 (d, J=8.0 Hz, 1H), 7.78 (d, J=8.8 Hz, 1H), 7.73-7.68 (m, 2H), 7.46 (d, J=8.0 Hz, 1H), 7.09 (d, J=8.2 Hz, 4H), 7.01 (d, J=8.2 Hz, 4H), 6.97 (dd, J$_1$=8.8 Hz, J$_2$=2.3 Hz, 1H), 6.75 (d, J=2.3 Hz, 1H), 4.55 (d, J=7.2 Hz, 2H), 3.76 (d, J=5.6 Hz, 2H), 2.54 (t, J=7.6 Hz, 4H), 2.35-2.32 (m, 2H), 1.61-1.55 (m, 4H), 1.44-1.41 (m, 8H), 1.31 (br, 38H), 1.22 (br, 16H), 0.91-0.79 (m, 16H).

$^{13}$C NMR (100 MHz, CDCl$_3$) δ: 159.41, 147.03, 145.81, 142.42, 141.50, 134.37, 133.76, 131.47, 131.40, 130.16, 129.48, 129.36, 128.68, 128.45, 127.28, 125.77, 125.64, 125.54, 125.43, 124.93, 124.73, 124.24, 122.17, 121.24, 118.83, 118.73, 118.04, 114.81, 114.50, 106.30, 71.82, 60.53, 50.58, 40.97, 39.05, 36.45, 33.07, 33.00, 32.99, 32.94, 32.84, 32.55, 32.45, 31.19, 31.07, 30.84, 30.77, 30.75, 30.66, 30.50, 30.40, 30.23, 27.96, 27.91, 27.53, 23.75, 23.64, 14.67, 14.66, 14.63, 14.60.

4.2 Synthesis of the Intermediate 21

In a dry Schlenk flask, 2.00 g of the intermediate 20 was dissolved in 20 mL tetrahydrofuran. The reaction system was cooled to 0° C. in an ice bath. 344 mg N-bromosuccinylimine was added to the reaction system, and the reaction is kept at 0° C. for 3 hours.

After the reaction was finished, 20 mL water was added to the reaction system. The resultant mixture solution was extracted with chloroform three times. The organic phases were combined and dried over anhydrous sodium sulfate. The desiccant was removed by filtration. The filtrate was concentrated, and then was separated by column chromatography with ethyl acetate/petroleum ether (volume ratio: 1/50) as the eluent to give 2.03 g of the intermediate 21 with a yield of 95%.

The structure of the intermediate 21 was characterized by NMR, mass spectrometry and elemental analysis. The result of mass spectrometry: 1216.78 ([M+H]$^+$). The results of elemental analysis: C, 81.89; H, 9.10; N, 1.16. The data of NMR characterization were as follows:

$^1$H NMR (400 MHz, THF-d$_8$) δ: 8.54-8.48 (m, 2H), 8.35 (d, J=2.7 Hz, 1H), 8.25 (d, J=9.0 Hz, 1H), 8.14 (dd, J$_1$=8.2 Hz, J$_2$=2.9 Hz, 1H), 8.08 (d, J=5.1 Hz, 1H), 7.74-7.70 (m, 1H), 7.50 (d, J=8.0 Hz, 1H), 7.11 (d, J=8.3 Hz, 4H), 7.02 (d, J=8.3 Hz, 4H), 6.98 (dd, J$_1$=8.8 Hz, J$_2$=2.5 Hz, 1H), 6.74 (d, J=2.4 Hz, 1H), 4.54 (t, J=5.4 Hz, 2H), 3.76 (d, J=5.8 Hz, 2H), 2.54 (t, J=7.9 Hz, 4H), 2.32-2.31 (m, 2H), 1.61-1.53 (m, 4H), 1.45-1.29 (m, 40H), 1.22-1.19 (m, 18H), 0.91-0.79 (m, 20H).

$^{13}$C NMR (100 MHz, THF-d$_8$) δ: 159.60, 146.93, 145.90, 143.03, 141.62, 134.56, 133.13, 131.52, 131.39, 130.22, 128.94, 128.65, 128.52, 128.43, 127.48, 126.27, 125.77, 125.26, 124.95, 124.57, 124.42, 122.74, 122.03, 118.85, 118.36, 118.03, 117.73, 117.50, 114.93, 106.24, 71.83, 60.54, 50.63, 40.84, 39.05, 36.45, 33.07, 33.00, 32.95, 32.84, 32.71, 32.67, 32.55, 32.44, 31.20, 31.08, 30.85, 30.81, 30.77, 30.75, 30.67, 30.50, 30.41, 30.23, 27.97, 27.92, 27.43, 23.75, 23.67, 23.64, 14.67, 14.65, 14.63, 14.60.

4.3 Synthesis of the Intermediate 22

In a dry Schlenk flask, 2.00 g of the intermediate 21, 641 mg of the compound 11 and 590 mg caesium carbonate were dissolved in 10 mL 1,4-dioxane. 46 mg Pd$_2$(dba)$_3$ as the catalyst and 23 mg P(t-Bu)$_3$ as the organophosphine ligand were added in a glove box filled with nitrogen. The reaction system was heated to 120° C., and the reaction is kept overnight.

After the reaction was finished, the reaction system was cooled to room temperature, and 20 mL water was added thereto. The resultant mixture solution was extracted with chloroform three times. The organic phases were combined and dried over anhydrous sodium sulfate. The desiccant was removed by filtration. The filtrate was concentrated, and then was separated by column chromatography with toluene/petroleum ether (volume ratio: 1/2) as the eluent to give 1.96 g of the intermediate 22 with a yield of 81%.

The structure of the intermediate 22 was characterized by NMR, mass spectrometry and elemental analysis. The result of mass spectrometry: 1473.95 ([M+H]$^+$). The results of elemental analysis: C, 83.16; H, 8.54; N, 2.86. The data of NMR characterization were as follows:

$^1$H NMR (400 MHz, THF-d$_8$) δ: 8.72 (d, J=8.0 Hz, 1H), 8.50 (d, J=8.0 Hz, 1H), 8.45 (d, J=7.6 Hz, 1H), 8.25 (s, 1H), 8.19-8.14 (m, 5H), 7.98 (s, 1H), 7.91 (d, J=7.4 Hz, 1H), 7.87 (d, J=7.4 Hz, 1H), 7.75 (t, J=7.8 Hz, 1H), 7.51 (d, J=7.9 Hz, 1H), 7.16 (d, J=8.0 Hz, 4H), 7.07 (d, J=8.0 Hz, 4H), 6.92 (m, J=8.6 Hz, 1H), 6.77 (s, 1H), 4.44 (d, J=7.0 Hz, 2H), 4.36 (t, J=6.5 Hz, 2H), 3.76 (d, J=5.4 Hz, 2H), 2.56 (t, J=7.7 Hz, 4H), 2.27-2.25 (m, 2H), 1.81-1.76 (m, 2H), 1.60-1.51 (m, 6H), 1.32-1.29 (m, 44H), 1.18-1.16 (m, 16H), 1.04-1.00 (m, 3H), 0.92-0.86 (m, 12H), 0.78-0.77 (m, 6H).

$^{13}$C NMR (100 MHz, THF-d$_8$) δ: 166.49, 159.66, 156.68, 154.13, 147.00, 146.09, 142.87, 142.34, 141.67, 135.99, 133.09, 132.70, 132.45, 131.44, 131.37, 130.85, 130.80, 130.45, 130.17, 129.39, 128.97, 128.56, 128.38, 127.54, 126.30, 125.93, 124.83, 124.59, 124.53, 122.78, 121.82, 119.66, 118.95, 118.86, 117.69, 116.31, 114.84, 106.12, 99.17, 91.10, 71.88, 65.46, 60.55, 50.62, 40.83, 39.05, 36.47, 33.07, 33.01, 32.99, 32.94, 32.83, 32.76, 32.57, 32.44, 32.03, 31.21, 31.10, 30.86, 30.77, 30.68, 30.51, 30.43, 30.24, 27.97, 27.93, 27.46, 23.76, 23.65, 20.37, 14.66, 14.60, 14.34.

4.4 Synthesis of the Target Product of Formula (II-a-e)

In a three-necked round-bottom flask, 1.96 g of the intermediate 22 was dissolved in a mixed solvent of 15 mL tetrahydrofuran and 5 mL water. 745 mg potassium hydroxide was added to the reaction system. The mixture is heated to 80° C., and the reaction is kept under stirring for 5 hours.

After the reaction was finished, the reaction system was cooled to room temperature, and 20 mL aqueous phosphoric acid solution (0.2 mol/L) was added. The resultant mixture solution was extracted with chloroform three times. The organic phases were combined and dried over anhydrous sodium sulfate. The desiccant was removed by filtration. The filtrate was concentrated, and then was separated by column chromatography with trichloromethane/methanol (volume ratio: 1/20) as the eluent to give 1.89 g of the target product of formula (II-a-e) with a yield of 99%.

The structure of the target product of formula (II-a-e) was characterized by NMR, mass spectrometry and elemental analysis. The data of NMR characterization were as follows:

$^1$H NMR (400 MHz, THF-d$_8$) δ: 8.69-8.67 (m, 1H), 8.46-8.37 (m, 2H), 8.21-8.17 (m, 6H), 7.90-7.88 (m, 3H), 7.73-7.68 (m, 1H), 7.51 (d, J=7.9 Hz, 1H), 7.18 (d, J=7.2 Hz, 4H), 7.07 (d, J=7.8 Hz, 4H), 6.94-6.92 (m, 1H), 6.78 (s, 1H), 4.42-4.37 (m, 2H), 3.76 (d, J=5.1 Hz, 2H), 2.83-2.77 (m, 2H), 2.56 (t, J=7.5 Hz, 4H), 2.23-2.21 (m, 2H), 1.60-1.57 (m, 4H), 1.44-1.29 (m, 40H), 1.15 (s, 16H), 0.93-0.85 (m, 14H), 0.78-0.76 (m, 6H).

$^{13}$C NMR (100 MHz, THF-d$_8$) δ: 159.64, 156.72, 154.21, 147.04, 146.06, 142.77, 141.66, 135.89, 133.49, 132.64, 132.52, 131.73, 132.52, 130.79, 129.99, 129.74, 129.27, 128.96, 128.57, 128.42, 127.49, 126.25, 125.93, 124.80, 124.57, 124.51, 122.75, 121.77, 119.59, 118.89, 118.64, 117.67, 116.33, 114.83, 106.11, 99.06, 91.14, 71.89, 60.56, 50.61, 46.42, 40.82, 40.09, 39.04, 36.47, 33.07, 33.01, 32.98, 32.93, 32.83, 32.75, 32.56, 32.44, 31.21, 31.08, 30.86, 30.77, 30.66, 30.51, 30.42, 30.73, 27.97, 27.93, 27.46, 23.75, 23.65, 14.61.

The result of high resolution mass spectrometry: 1416.88576. The results of elemental analysis: C, 83.08; H, 8.32; N, 2.96. The experimental results show that an organic dye having the structure of formula (II-a-e) was prepared in the present invention.

Example 5

The reaction scheme is shown as follows:

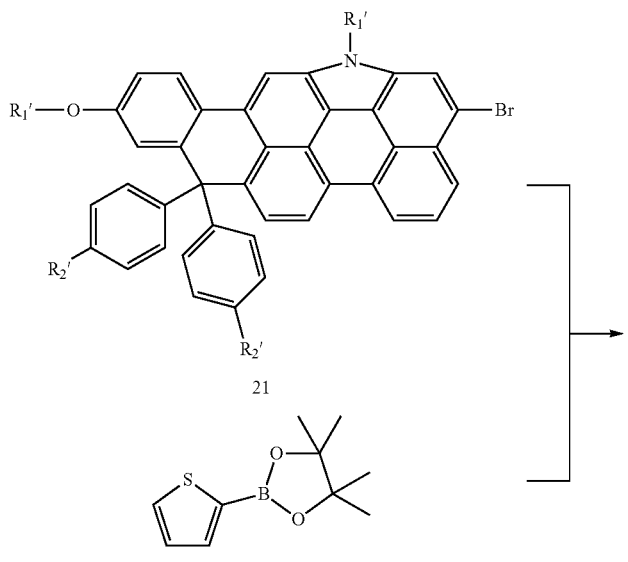

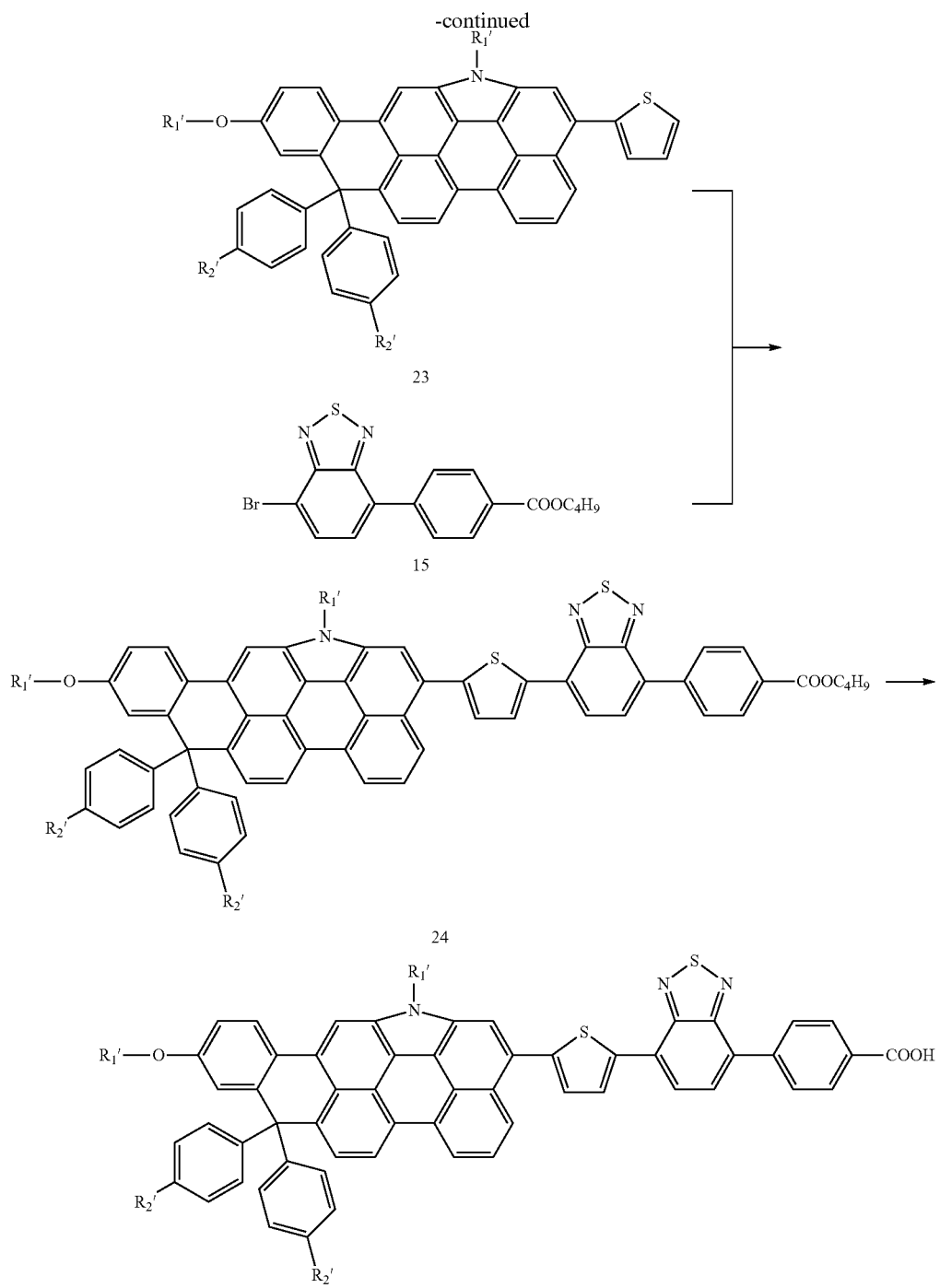

Formula II-c-e

5.1 Synthesis of the Intermediate 23 Formula

In a three-necked round-bottom flask, 1.00 g of the intermediate 21 from Example 4, 184 mg of the compound 13 and 871 mg potassium phosphate were dissolved in a mixed solvent of 20 mL 1,4-dioxane and 4 mL water. 4 mg Pd(OAc)$_2$ as the catalyst and 8 mg 2-dicyclohexylphosphino-2',6'-dimethoxybiphenyl (Sphos) as the organophosphine ligand were added under the protection of argon. The reaction system was heated to 45° C., and the reaction is kept for 12 hours.

After the reaction was finished, the reaction system was cooled to room temperature, and 20 mL water was added thereto. The resultant mixture solution was extracted with chloroform three times. The organic phases were combined and dried over anhydrous sodium sulfate. The desiccant was removed by filtration. The filtrate was concentrated, and then was separated by column chromatography with ethyl acetate/petroleum ether (volume ratio: 1/50) as the eluent to give 832 mg of the intermediate 23 with a yield of 83%.

The structure of the intermediate 23 was characterized by NMR, mass spectrometry and elemental analysis. The result of mass spectrometry: 1220.85 ([M+H]⁺). The results of elemental analysis: C, 85.61; H, 9.31; N, 1.18. The data of NMR characterization were as follows:

¹H NMR (400 MHz, THF-d₈) δ: 8.65 (d, J=7.6 Hz, 1H), 8.62 (d, J=8.1 Hz, 1H), 8.46 (s, 1H), 8.36 (d, J=8.3 Hz, 1H), 8.27 (d, J=8.9 Hz, 1H), 7.99 (s, 1H), 7.76 (t, J=8.1 Hz, 1H), 7.53 (d, J=5.2 Hz, 1H), 7.49 (d, J=8.0 Hz, 1H), 7.43 (d, J=3.4 Hz, 1H), 7.24 (dd, J₁=5.0 Hz, J₂=3.5 Hz, 1H), 7.08 (d, J=8.3 Hz, 4H), 7.01 (d, J=8.3 Hz, 4H), 6.97 (dd, J₁=8.8 Hz, J₂=2.6 Hz, 1H), 6.73 (d, J=2.5 Hz, 1H), 4.73 (d, J=7.0 Hz, 2H), 3.76 (d, J=5.7 Hz, 2H), 2.54 (t, J=7.6 Hz, 4H), 2.43-2.41 (m, 2H), 1.59-1.53 (m, 4H), 1.50-1.40 (m, 8H), 1.30-1.18 (m, 44H), 0.90-0.85 (m, 10H), 0.83-0.77 (m, 6H).

¹³C NMR (100 MHz, CDCl₃) δ: 159.64, 158.90, 156.09, 143.06, 142.47, 140.95, 140.49, 140.41, 135.90, 134.76, 133.23, 133.07, 132.04, 131.61, 130.40, 129.34, 127.42, 127.29, 126.67, 126.10, 125.97, 125.62, 125.00, 123.88, 123.72, 121.85, 121.74, 119.63, 118.55, 115.29, 113.61, 113.37, 112.48, 109.10, 71.87, 64.78, 53.73, 39.38, 38.98, 36.51, 33.05, 32.98, 32.86, 32.59, 32.49, 32.06, 31.94, 31.17, 30.94, 30.83, 30.73, 30.65, 30.58, 30.48, 30.37, 30.26, 28.01, 23.74, 23.66, 14.70, 14.65.

5.2 Synthesis of the Intermediate 24

In a three-necked round-bottom flask dried over flame, 800 mg of the intermediate 23 was dissolved in 20 mL anhydrous tetrahydrofuran and cooled to −78° C. 0.45 mL t-butyl lithium (1.6 mol/L, in n-hexane) was added under the protection of argon, and stirred for 1 h at this low temperature. Then 144 mg trimethyl tin chloride was added, the mixture is heated to room temperature, and the reaction is kept overnight.

After the reaction was finished, 20 mL water was added to the reaction system. The resultant mixture solution was extracted with chloroform three times. The organic phases were combined and dried over anhydrous sodium sulfate. The desiccant was removed by filtration, and the filtrate was concentrated to give a viscous liquid, which was sufficiently dried and then dissolved in 20 mL toluene. 514 mg of the compound 15 and 55 mg Pd(PPh₃)₂Cl₂ as the catalyst was added under the protection of argon. The reaction system was heated to reflux, and the reaction is kept overnight.

After the reaction was finished, the reaction system was cooled to room temperature, and 20 mL water was added thereto. The resultant mixture solution was extracted with chloroform three times. The organic phases were combined and dried over anhydrous sodium sulfate. The desiccant was removed by filtration. The filtrate was concentrated, and then was separated by column chromatography with ethyl acetate/petroleum ether (volume ratio: 1/20) as the eluent to give 622 mg of the intermediate 24 with a yield of 62%.

The structure of the intermediate 24 was characterized by NMR, mass spectrometry and elemental analysis. The result of mass spectrometry: 1531.93 ([M+H]⁺). The results of elemental analysis: C, 81.52; H, 8.34; N, 2.78. The data of NMR characterization were as follows:

¹H NMR (400 MHz, THF-d₈) δ: 8.54 (d, J=8.0 Hz, 1H), 8.49 (d, J=8.3 Hz, 2H), 8.33 (s, 1H), 8.25 (d, J=8.8 Hz, 2H), 8.13-8.12 (m, 4H), 7.97 (s, 1H), 7.88 (d, J=7.3 Hz, 1H), 7.72-7.67 (m, 2H), 7.56-7.49 (m, 2H), 7.18 (d, J=8.1 Hz, 4H), 7.06 (d, J=8.1 Hz, 4H), 6.97 (d, J=8.7 Hz, 4H), 6.80-6.76 (m, 1H), 4.47 (br, 2H), 4.35 (t, J=6.5 Hz, 2H), 3.77 (br, 2H), 2.62-2.54 (m, 4H), 2.37-2.31 (m, 1H), 1.82-1.76 (m, 2H), 1.57-1.50 (m, 6H), 1.32-1.29 (m, 44H), 1.19-1.14 (m, 16H), 1.02-1.00 (m, 4H), 0.93-0.85 (m, 12H), 0.77-0.76 (m, 6H).

¹³C NMR (100 MHz, CDCl₃) δ: 166.54, 159.58, 154.72, 153.65, 147.20, 147.06, 145.93, 142.70, 142.42, 141.61, 139.55, 135.03, 133.32, 131.70, 131.56, 131.46, 131.08, 130.42, 130.17, 130.03, 129.74, 129.70, 129.45, 129.24, 128.78, 128.65, 128.55, 128.15, 127.48, 125.95, 125.90, 124.62, 124.54, 122.61, 121.80, 118.96, 118.88, 117.86, 115.98, 115.92, 114.83, 106.23, 71.87, 65.43, 60.58, 50.43, 40.87, 39.05, 36.47, 33.08, 33.00, 32.95, 32.84, 32.74, 32.71, 32.55, 32.44, 32.03, 31.21, 31.13, 30.86, 30.79, 30.77, 30.72, 30.51, 30.46, 30.24, 27.98, 27.93, 27.44, 27.43, 23.76, 23.69, 23.65, 20.37, 14.70, 14.64, 14.38.

5.3 Synthesis of the Target Product of Formula (II-c-e)

In a three-necked round-bottom flask, 600 mg of the intermediate 24 was dissolved in a mixed solvent of 15 mL tetrahydrofuran and 5 mL water. 219 mg potassium hydroxide was added to the reaction system, then the mixture is heated to 80° C., and the reaction is kept under stirring for 5 hours.

After the reaction was finished, the reaction system was cooled to room temperature, and 20 mL aqueous phosphoric acid solution (0.2 mol/L) was added. The resultant mixture solution was extracted with chloroform three times. The organic phases were combined and dried over anhydrous sodium sulfate. The desiccant was removed by filtration. The filtrate was concentrated, and then was separated by column chromatography with trichloromethane/methanol (volume ratio: 1/20) as the eluent to give 572 mg of the target product of formula (II-c-e) with a yield of 99%.

The structure of the target product of formula (II-c-e) was characterized by NMR, mass spectrometry and elemental analysis. The data of NMR characterization were as follows:

¹H NMR (400 MHz, THF-d₈) δ: 8.70 (d, J=7.6 Hz, 1H), 8.65 (d, J=8.1 Hz, 1H), 8.56 (d, J=8.3 Hz, 1H), 8.48 (s, 1H), 8.44 (d, J=3.8 Hz, 1H), 8.29 (d, J=9.0 Hz, 1H), 8.23-8.15 (m, 6H), 8.00 (d, J=7.5 Hz, 1H), 7.83 (t, J=7.80 Hz, 1H), 7.61 (d, J=3.8 Hz, 1H), 7.51 (d, J=8.0 Hz, 1H), 7.10 (d, J=8.4 Hz, 4H), 7.02 (d, J=8.3 Hz, 4H), 6.98 (dd, =8.9 Hz, J₂=2.6 Hz, 1H), 6.74 (d, J=2.6 Hz, 1H), 4.78 (d, J=7.3 Hz, 2H), 3.76 (d, J=5.7 Hz, 2H), 2.54 (t, J=7.7 Hz, 4H), 2.08-2.01 (m, 4H), 1.59-1.52 (m, 14H), 1.40-1.16 (m, 46H), 0.90-0.85 (m, 14H), 0.79-0.76 (m, 6H).

¹³C NMR (100 MHz, THF-d₈) δ: 167.71, 159.58, 154.87, 153.78, 147.18, 147.02, 145.95, 142.75, 142.32, 141.59, 139.68, 135.11, 133.39, 132.00, 131.79, 131.55, 131.42, 130.75, 130.70, 130.68, 130.16, 130.01, 129.70, 129.67, 129.50, 129.26, 128.82, 128.77, 128.52, 128.20, 127.49, 125.97, 125.90, 125.77, 124.67, 124.64, 124.57, 122.60, 121.82, 118.92, 117.90, 116.04, 106.26, 71.85, 60.55, 50.51, 40.91, 39.05, 36.46, 36.37, 33.07, 33.00, 32.96, 32.84, 32.77, 32.74, 32.56, 32.44, 31.20, 31.14, 30.89, 30.87, 30.85, 30.80, 30.72, 30.64, 30.51, 30.45, 30.43, 30.40, 30.24, 28.19, 27.97, 27.92, 27.47, 26.59, 23.75, 23.73, 23.69, 23.65, 14.67, 14.66, 14.60.

The result of high resolution mass spectrometry: 1474.87358. The results of elemental analysis: C, 81.43; H, 8.16; N, 2.83. The experimental results show that an organic dye having the structure of formula (II-c-e) was prepared in the present invention.

Example 6
The reaction scheme is shown as follows:
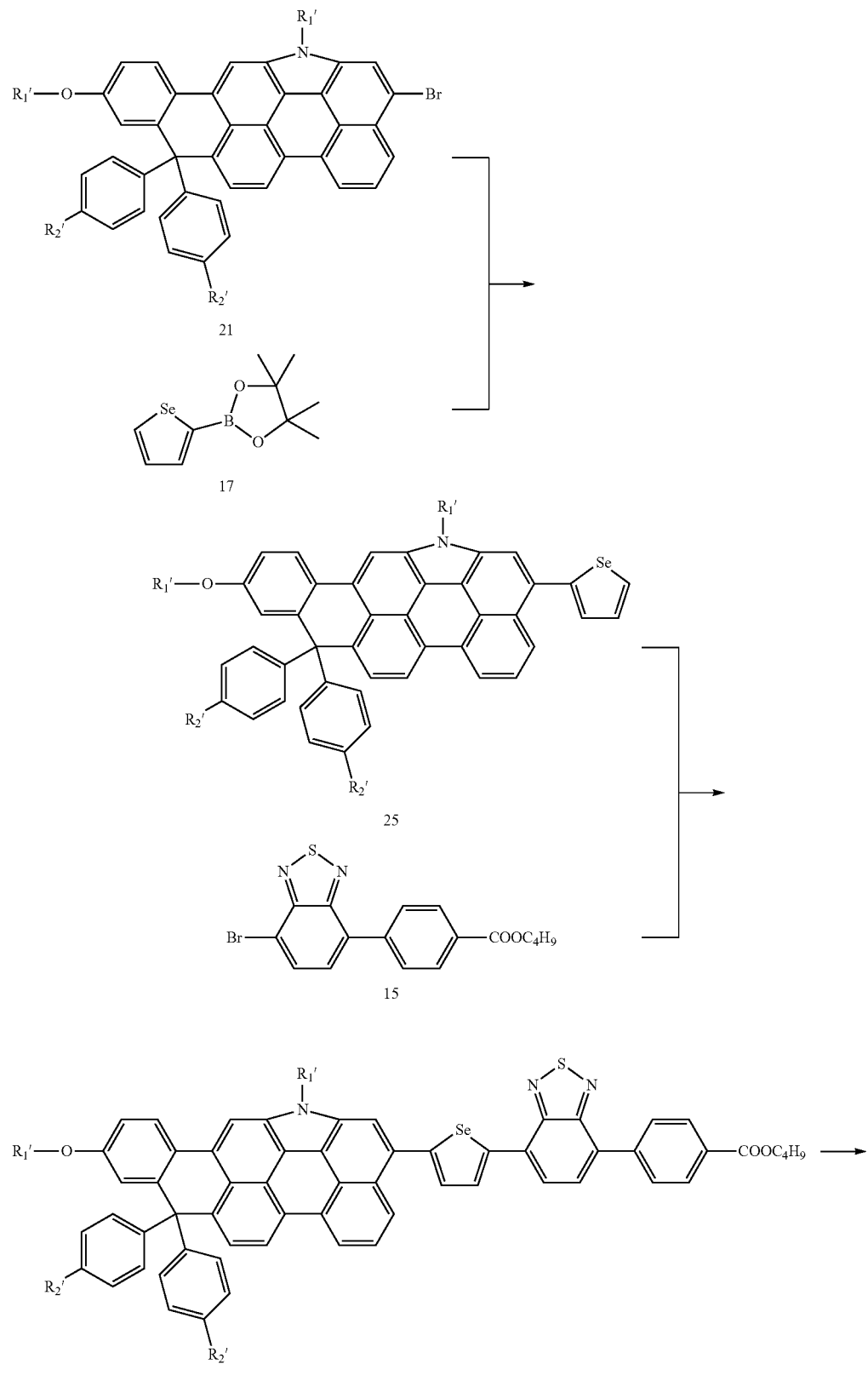

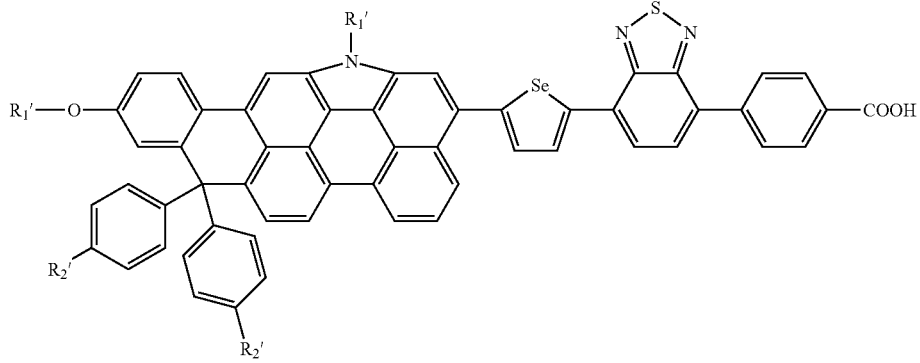

Formula II-d-e

6.1 Synthesis of the Intermediate 25

In a three-necked round-bottom flask, 1.00 g of the intermediate 21 from Example 4, 399 mg of the compound 17 and 871 mg potassium phosphate were dissolved in a mixed solvent of 20 mL 1,4-dioxane and 4 mL water. 4 mg Pd(OAc)$_2$ as the catalyst and 8 mg 2-dicyclohexylphosphino-2',6'-dimethoxybiphenyl (Sphos) as the organophosphine ligand were added under the protection of argon. The reaction system was heated to reflux, and the reaction is kept for 12 hours.

After the reaction was finished, the reaction system was cooled to room temperature, and 20 mL water was added thereto. The resultant mixture solution was extracted with chloroform three times. The organic phases were combined and dried over anhydrous sodium sulfate. The desiccant was removed by filtration. The filtrate was concentrated, and then was separated by column chromatography with ethyl acetate/petroleum ether (volume ratio: 1/50) as the eluent to give 864 mg of the intermediate 25 with a yield of 83%.

The structure of the intermediate 25 was characterized by NMR, mass spectrometry and elemental analysis. The result of mass spectrometry: 1268.81 ([M+H]$^+$). The results of elemental analysis: C, 82.43; H, 8.92; N, 1.12. The data of NMR characterization were as follows:

$^1$H NMR (400 MHz, THF-d$_8$) δ: 8.56-8.50 (m, 2H), 8.37-8.34 (m, 2H), 8.24 (d, J=8.8 Hz, 1H), 8.17 (d, J=5.4 Hz, 1H), 7.88 (d, J=5.3 Hz, 1H), 7.69-7.64 (m, 1H), 7.50 (d, J=7.6 Hz, 2H), 7.44-7.43 (m, 1H), 7.13 (d, J=8.1 Hz, 4H), 7.03 (d, J=8.2 Hz, 4H), 6.97 (d, J=8.6 Hz, 1H), 6.78 (br, 1H), 4.52 (br, 2H), 3.77 (d, J=5.5 Hz, 2H), 2.55 (t, J=7.5 Hz, 4H), 2.33-2.29 (m, 1H), 1.74-1.73 (m, 1H), 1.60-1.54 (m, 4H), 1.44-1.32 (m, 44H), 1.21-1.18 (m, 16H), 0.92-0.85 (m, 12H), 0.83-0.80 (m, 6H).

$^{13}$C NMR (100 MHz, CDCl$_3$) δ: 159.49, 151.05, 147.02, 145.88, 142.56, 141.52, 134.80, 133.31, 132.02, 131.71, 131.59, 131.41, 130.70, 129.94, 129.86, 129.30, 128.82, 128.50, 127.44, 125.70, 124.68, 122.46, 121.69, 118.90, 118.61, 117.95, 116.09, 114.84, 106.21, 71.84, 60.54, 50.44, 40.84, 39.05, 36.47, 33.07, 33.00, 32.95, 32.84, 32.74, 32.53, 32.46, 31.20, 31.10, 30.85, 30.76, 30.69, 30.50, 30.43, 30.23, 27.97, 27.93, 27.44, 23.76, 23.68, 23.66, 14.65.

6.2 Synthesis of the Intermediate 26

In a three-necked round-bottom flask dried over flame, 840 mg of the intermediate 25 was dissolved in 20 mL anhydrous tetrahydrofuran and cooled to −78° C. 0.45 mL t-butyl lithium (1.6 mol/L, in n-hexane) was added under the protection of argon, and stirred for 1 h at this low temperature. Then 144 mg trimethyl tin chloride was added, the mixture is heated to room temperature, and the reaction is kept overnight.

After the reaction was finished, 20 mL water was added to the reaction system. The resultant mixture solution was extracted with chloroform three times. The organic phases were combined and dried over anhydrous sodium sulfate. The desiccant was removed by filtration, and the filtrate was concentrated to give a viscous liquid, which was sufficiently dried and then dissolved in 20 mL toluene. 514 mg of the compound 15 and 55 mg Pd(PPh$_3$)$_2$Cl$_2$ as the catalyst were added under the protection of argon. The reaction system was heated to reflux, and the reaction is kept overnight.

After the reaction was finished, the reaction system was cooled to room temperature, and 20 mL water was added thereto. The resultant mixture solution was extracted with chloroform three times. The organic phases were combined and dried over anhydrous sodium sulfate. The desiccant was removed by filtration. The filtrate was concentrated, and then was separated by column chromatography with ethyl acetate/petroleum ether (volume ratio: 1/20) as the eluent to give 654 mg of the intermediate 26 with a yield of 62%.

The structure of the intermediate 26 was characterized by NMR, mass spectrometry and elemental analysis. The result of mass spectrometry: 1579.86 ([M+H]$^+$). The results of elemental analysis: C, 79.20; H, 8.08; N, 2.64. The data of NMR characterization were as follows:

$^1$H NMR (400 MHz, THF-d$_8$) δ: 8.59-8.53 (m, 4H), 8.43-8.24 (m, 3H), 8.13-8.07 (m, 4H), 8.00-7.94 (m, 2H), 7.78-7.66 (m, 3H), 7.52 (d, J=7.9 Hz, 1H), 7.14 (d, J=7.0 Hz, 4H), 7.03 (d, J=7.0 Hz, 4H), 6.97 (dd, J$_1$=8.7 Hz, J$_2$=1.6 Hz, 1H), 6.78 (br, 1H), 4.55 (br, 2H), 4.35 (t, J=6.6 Hz, 2H), 3.76 (d, J=5.6 Hz, 2H), 2.56-2.52 (m, 4H), 2.34 (br, 2H), 1.81-1.76 (m, 2H), 1.60-1.49 (m, 6H), 1.43-1.29 (m, 44H), 1.20-1.14 (m, 16H), 0.91-0.84 (m, 14H), 0.77-0.75 (m, 6H).

$^{13}$C NMR (100 MHz, CDCl$_3$) δ: 166.53, 159.57, 154.94, 154.60, 153.90, 147.02, 145.94, 144.31, 142.71, 142.49, 141.60, 135.07, 133.48, 132.01, 131.74, 131.56, 131.43, 131.11, 130.55, 130.44, 130.30, 130.08, 130.02, 129.80, 129.30, 128.53, 127.51, 125.92, 125.77, 125.04, 124.75, 124.66, 122.58, 121.86, 118.94, 118.84, 117.96, 115.89, 114.85, 106.28, 71.87, 65.43, 60.56, 50.48, 40.90, 39.05, 36.46, 33.07, 33.01, 32.96, 32.84, 32.78, 32.75, 32.55, 32.44, 32.03, 31.20, 31.14, 30.85, 30.81, 30.76, 30.72, 30.51, 30.46, 30.24, 27.97, 27.92, 27.46, 23.75, 23.70, 23.65, 20.37, 14.68, 14.66, 14.61, 14.34.

6.3 Synthesis of the Target Product of Formula (II-d-e)

In a three-necked round-bottom flask, 630 mg of the intermediate 26 was dissolved in a mixed solvent of 15 mL tetrahydrofuran and 5 mL water. 219 mg potassium hydroxide was added to the reaction system, then the mixture is heated to 80° C., and the reaction is kept under stirring for 5 hours.

After the reaction was finished, the reaction system was cooled to room temperature, and 20 mL aqueous phosphoric acid solution (0.2 mol/L) was added. The resultant mixture solution was extracted with chloroform three times. The organic phases were combined and dried over anhydrous sodium sulfate. The desiccant was removed by filtration. The filtrate was concentrated, and then was separated by column chromatography with trichloromethane/methanol (volume ratio: 1/20) as the eluent to give 595 mg of the target product of formula (II-d-e) with a yield of 99%.

The structure of the target product of formula (II-d-e) was characterized by NMR, mass spectrometry and elemental analysis. The data of NMR characterization were as follows:

$^1$H NMR (400 MHz, THF-d$_8$) δ: 8.69 (d, J=7.6 Hz, 1H), 8.65 (d, J=8.1 Hz, 1H), 8.59 (d, J=8.3 Hz, 1H), 8.48-8.47 (m, 2H) 8.29 (d, J=9.0 Hz, 1H), 8.25-8.17 (m, 5H), 8.13 (s, 1H), 8.00 (d, J=7.6 Hz, 1H), 7.88 (s, 1H), 7.83 (t, J=8.0 Hz, 1H), 7.75 (d, J=4.0 Hz, 1H), 7.51 (d, J=8.0 Hz, 1H), 7.09 (d, J=8.4 Hz, 4H), 7.02 (d, J=8.4 Hz, 4H), 6.98 (dd, J$_1$=8.8 Hz, J$_2$=2.6 Hz, 1H), 6.74 (d, J=2.6 Hz, 1H), 4.77 (d, J=7.2 Hz, 2H), 3.76 (d, J=5.7 Hz, 2H), 2.54 (t, J=7.9 Hz, 4H), 2.09-2.04 (m, 1H), 1.61-1.40 (m, 12H), 1.31-1.24 (m, 46H), 1.19-1.13 (m, 6H), 0.90-0.85 (m, 12H), 0.80-0.78 (m, 6H).

$^{13}$C NMR (100 MHz, THF-d$_8$) δ: 167.63, 159.57, 154.89, 154.67, 153.96, 147.00, 145.94, 144.40, 142.73, 142.32, 141.59, 135.10, 133.51, 132.05, 131.81, 131.77, 131.54, 131.41, 130.76, 130.57, 130.27, 130.14, 130.11, 129.97, 129.80, 129.31, 128.58, 128.51, 127.52, 125.96, 125.93, 125.75, 125.12, 124.77, 124.69, 124.68, 122.57, 121.86, 118.89, 118.87, 117.98, 115.94, 114.87, 106.29, 79.62, 71.84, 60.55, 50.53, 40.93, 39.05, 36.46, 33.07, 33.00, 32.97, 32.84, 32.80, 32.76, 32.56, 32.44, 31.20, 31.15, 30.84, 30.82, 30.75, 30.72, 30.50, 30.45, 30.24, 27.96, 27.91, 27.48, 27.48, 23.75, 23.70, 23.64, 14.66, 14.64, 14.59.

The result of high resolution mass spectrometry: 1522.81882. The results of elemental analysis: C, 78.95; H, 7.89; N, 2.74. The experimental results show that an organic dye having the structure of formula (II-d-e) was prepared in the present invention.

Example 7

The reaction scheme is shown as follows:

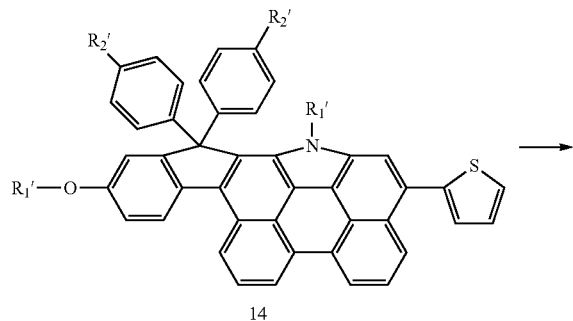

14

-continued

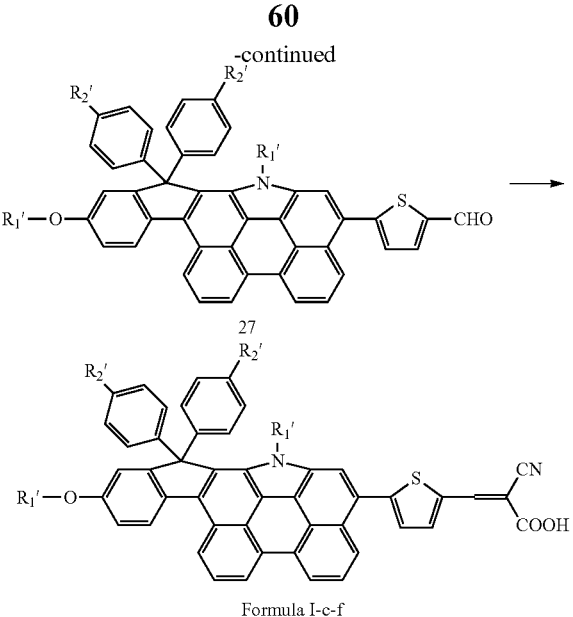

27

Formula I-c-f 7.1 Synthesis of the Intermediate 27

In a dry Schlenk flask, 800 mg of the intermediate 14 from Example 2 was dissolved in 20 mL 1,2-dichloroethane. The reaction system was cooled to 0° C. in an ice bath. 0.15 mL N, N-dimethyl formamide and 0.08 mL phosphorus oxychloride were added to the reaction system, then the mixture is heated to 40° C., and the reaction is kept overnight.

After the reaction was finished, the reaction system was cooled to room temperature, and 20 mL water was added and stirred for 2 hours. The mixture was extracted with chloroform three times. The organic phases were combined and dried over anhydrous sodium sulfate. The desiccant was removed by filtration. The filtrate was concentrated, and then was separated by column chromatography with ethyl acetate/petroleum ether (volume ratio: 1/20) as the eluent to give 679 mg of the intermediate 27 with a yield of 83%.

The structure of the intermediate 27 was characterized by NMR, mass spectrometry and elemental analysis. The result of high resolution mass spectrometry: 1248.86. The results of elemental analysis: C, 84.66; H, 9.10; N, 1.14. The data of NMR characterization were as follows:

$^1$H NMR (400 MHz, THF-d$_8$) δ: 9.95 (s, 1H), 9.09 (d, J=8.4 Hz, 1H), 8.84 (d, J=7.6 Hz, 1H), 8.79 (d, J=7.6 Hz, 1H), 8.49 (d, J=8.6 Hz, 1H), 8.41 (d, J=8.3 Hz, 1H), 8.01-7.94 (m, 3H), 7.83 (t, J=7.9 Hz, 1H), 7.57-7.53 (m, 5H), 7.09-7.07 (m, 5H), 6.99 (d, J=7.1 Hz, 1H), 4.26 (d, J=8.0 Hz, 2H), 3.85 (d, J=5.2 Hz, 2H), 2.57-2.53 (m, 4H), 2.12-2.10 (m, 1H), 1.74-1.71 (m, 1H), 1.57-1.54 (m, 4H), 147-1.46 (m, 4H), 1.35-1.30 (m, 36H), 1.19-1.05 (m, 16H), 0.90-0.79 (m, 16H), 0.78-0.74 (m, 6H).

$^{13}$C NMR (100 MHz, THF-d$_8$) δ: 182.98, 159.81, 159.00, 154.40, 144.57, 142.58, 141.00, 140.33, 140.25, 137.74, 136.66, 134.54, 133.42, 132.83, 131.76, 130.35, 129.37, 129.08, 128.22, 128.07, 127.32, 126.67, 126.38, 126.26, 125.50, 124.32, 124.03, 122.25, 122.13, 120.48, 118.25, 118.17, 113.72, 113.31, 71.90, 64.79, 53.82, 39.39, 38.99, 36.50, 33.04, 32.98, 32.85, 32.61, 32.48, 32.06, 31.94, 31.17, 30.93, 30.82, 30.65, 30.56, 30.48, 30.37, 30.26, 28.05, 28.01, 27.96, 23.73, 23.65, 14.62.

7.2 Synthesis of the Target Product of Formula (I-c-f)

In a dry two-necked round-bottom flask, 600 mg of the intermediate 27 was dissolved in a mixed solvent of acetonitrile and dichloromethane (volume ratio: 1/2). 94 mg cyanoacrylic acid and 55 mg ammonium acetate were added. The reaction system was heated to reflux, and the reaction is kept for 48 hours.

After the reaction was finished, the temperature of the reaction system was decreased to room temperature. After 30 mL distilled water was added, the mixture was extracted with chloroform three times. The organic phases were combined and dried over anhydrous sodium sulfate. The desiccant was removed by filtration. The filtrate was concentrated, and then was separated by column chromatography with methanol/chloroform (volume ratio: 1/20) as the eluent to give the target product of formula (I-c-f). Then the product of the formula (I-c-f) was dissolved in chloroform, washed by 0.2 mol/L aqueous phosphoric acid solution and distilled for several times by turns. The organic phase was concentrated, dried under reduced pressure to give 600 mg of the target product of formula (I-c-f) as a purple solid with a yield of 95%.

The structure of the target product of formula (I-c-f) was characterized by NMR, mass spectrometry and elemental analysis. The data of NMR characterization were as follows:

$^1$H NMR (400 MHz, THF-d$_8$) δ: 9.08 (d, J=7.8 Hz, 1H), 8.82-8.76 (m, 2H), 8.49 (d, J=8.6 Hz, 1H), 8.46 (s, 1H), 8.41 (d, J=7.8 Hz, 1H), 8.04-7.96 (m, 3H), 7.81 (br, 1H), 7.59-7.54 (m, 5H), 7.09 (d, J=7.3 Hz, 4H), 6.99 (d, J=7.9 Hz, 1H), 4.29-4.27 (m, 2H), 3.85 (br, 2H), 2.55-2.54 (m, 4H), 2.16-2.12 (m, 2H), 2.02 (br, 1H), 1.72-1.71 (m, 1H), 1.58-1.56 (m, 4H), 1.46 (br, 2H), 1.42-1.29 (m, 36H), 1.15-1.05 (m, 16H), 0.90-0.86 (m, 12H), 0.80-0.67 (m, 9H).

$^{13}$C NMR (100 MHz, THF-d$_8$) δ: 159.80, 159.01, 154.78, 146.62, 142.58, 140.96, 140.33, 140.27, 139.13, 136.78, 136.71, 134.56, 133.52, 132.88, 131.74, 130.68, 130.35, 129.38, 127.99, 127.96, 127.29, 126.64, 126.43, 126.25, 125.46, 124.28, 124.03, 122.24, 122.11, 120.55, 118.28, 116.94, 113.71, 113.32, 71.88, 64.80, 53.82, 39.38, 39.01, 36.50, 33.03, 32.98, 32.84, 32.61, 32.47, 32.09, 31.93, 31.16, 30.92, 30.81, 30.73, 30.63, 30.54, 30.47, 30.37, 30.26, 28.05, 28.00, 27.92, 23.73, 23.65, 14.63.

The result of high resolution mass spectrometry: 1314.85438. The results of elemental analysis: C, 83.09; H, 8.69; N, 2.14. The experimental results show that an organic dye having the structure of formula (I-c-f) was prepared in the present invention.

Example 8

An organic dye-sensitized solar cell was prepared in accordance with the document (*Energy Environ. Sci.*, 2010, 3, 1924). Specifically, the organic dye produced in each of Example 1-7 were prepared into a 100 μmol/L ethanol/toluene (volume ratio: 9:1) solution, respectively. A bilayer membrane electrode having a TiO$_2$ structure was immersed in the dye solution for 12 hours. Then, the electrode was taken out. A glass electrode coated with nanoplatinum was sealed annularly by a hot melt method. At last, an electrolyte was filled into the gap between the two electrodes, thereby a dye-sensitized solar cell was constructed.

Under the simulated AM1.50 sunlight at 100 mW cm$^{-2}$, the dye-sensitized solar cells obtained were tested for the performance. The test results were in Table 1. Table 1 shows the results of the performance tests of the dye-sensitized solar cells made from the organic dyes according to the Example 8 of the invention. As known from Table 1, the organic dye-sensitized solar cells made from the organic dye provided by the present invention have a relatively high power conversion efficiency.

TABLE 1

The results of the performance tests of the dye-sensitized solar cells in Example 8 of the present invention

| Organic dyes | Short circuit current density [mA·cm$^{-2}$] | Open circuit voltage [mV] | Filling factor | Cell Efficiency [%] |
|---|---|---|---|---|
| I-a-e | 17.03 | 956 | 0.770 | 12.5 |
| I-c-e | 15.58 | 862 | 0.748 | 10.1 |
| I-d-e | 13.36 | 868 | 0.725 | 8.41 |
| II-a-e | 15.26 | 885 | 0.745 | 10.1 |
| II-c-e | 10.55 | 871 | 0.636 | 5.84 |
| II-d-e | 9.31 | 863 | 0.647 | 5.20 |
| I-c-f | 15.81 | 897 | 0.744 | 10.56 |

As known from the above Examples, the present invention provides a glass of organic dyes. The present invention prepares two donor units having a rigid coplanar structure by conjugate extension of phenanthrenocarbazole. The relative energy level of the molecule is adjusted by various acceptor units and modifying groups, so that various acceptor organic dyes with high efficiency are designed and synthesized. The power conversion efficiency of the dye-sensitized solar cell made from this kind of organic dye may be up to 12.5%. This is currently the highest efficiency achieved by a non-metallic organic dye-sensitized solar cell. The organic dyes provided by the present invention have novel structure, plenty of sources, relatively low costs, and better prospect in industrialization production. Furthermore, the processes for producing the organic dye are relatively simple, convenient and have a high yield.

The invention claimed is:

1. An organic dye having a rigid donor, which has a structure of formula (I) or formula (II):

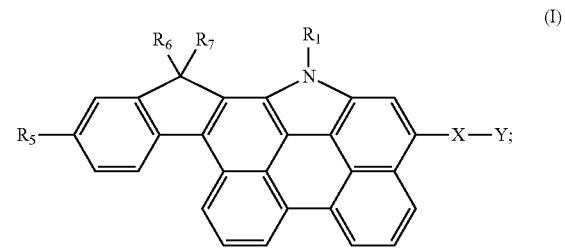

(I)

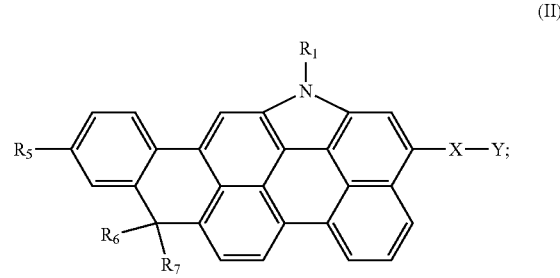

(II)

Wherein,

R$_1$ is selected from H or C$_1$-C$_{18}$ alkyl;

R$_5$ is selected from H, C$_1$-C$_{18}$ alkyl or C$_1$-C$_{18}$ alkoxy;

$R_6$ and $R_7$ are independently selected from H, $C_1$-$C_{18}$ alkyl, $C_1$-$C_{18}$ alkoxyphenyl or $C_1$-$C_{18}$ alkylphenyl;

X is selected from any one of the groups represented by formulae (a) to (d):

(a)

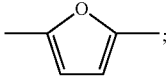
(b)

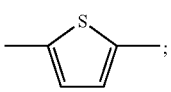
(c)

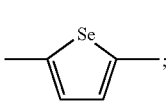
(d)

Y is selected from a group represented by formula (e) or formula (f):

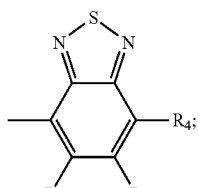
(e)

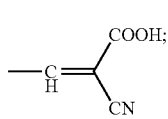
(f)

in the formula (e), $R_2$ and $R_3$ are independently selected from H, F, $C_1$-$C_{18}$ alkyl or $C_1$-$C_{18}$ alkoxyphenyl; $R_4$ is selected from any one of the groups represented by formulae (g) to (i):

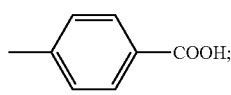
(g)

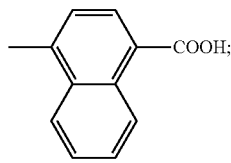
(h)

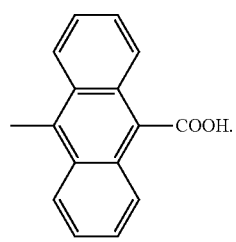
(i)

2. The organic dye according to claim 1, wherein $R_1$ is selected from $C_2$-$C_{16}$ alkyl; $R_5$ is selected from $C_2$-$C_{16}$ alkoxy; and $R_6$ and $R_7$ are independently selected from $C_2$-$C_{12}$ alkylphenyl.

3. The organic dye according to claim 2, wherein X is selected from a group represented by formula (a), formula (c) or formula (d).

4. The organic dye according to claim 1, wherein Y is selected from a group represented by formula (e); and in the formula (e), $R_2$ and $R_3$ is H; $R_4$ is a group represented by formula (g).

5. The organic dye according to claim 1, wherein X is selected from a group represented by formula (c) or formula (d); Y is a group represented by formula (f).

6. A process for producing an organic dye having a rigid donor, which comprises following steps:

subjecting a rigid donor compound having the structure of formula (III) to bromination and Heck coupling reaction successively, or subjecting a rigid donor compound having the structure of formula (III) to Suzuki reaction and Stille coupling reaction successively, to obtain a first dye precursor ester; and reacting the first dye precursor ester in the presence of a strong base to give an organic dye having the structure of formula (I);

or, subjecting a rigid donor compound having the structure of formula (IV) to bromination and Heck coupling reaction successively, or subjecting rigid donor compound having the structure of formula (IV) to Suzuki reaction and Stille coupling reaction successively, to obtain a second dye precursor ester; and reacting the second dye precursor ester in the presence of a strong base to give an organic dye having the structure of formula (II),

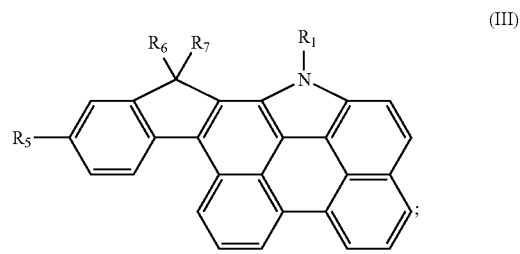
(III)

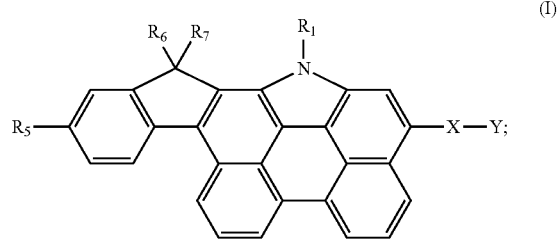
(I)

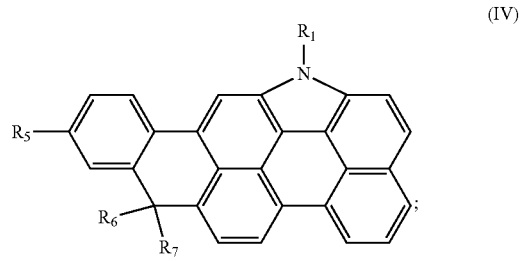
(IV)

-continued (II)

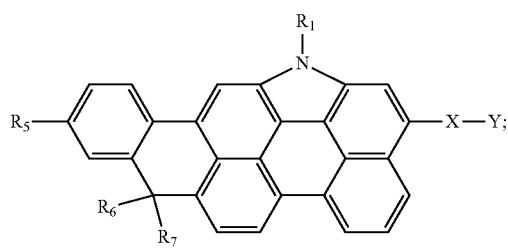

wherein, $R_1$ is selected from H or $C_1$-$C_{18}$ alkyl;
$R_5$ is selected from H, $C_1$-$C_{18}$ alkyl or $C_1$-$C_{18}$ alkoxy;
$R_6$ and $R_7$ are independently selected from H, $C_1$-$C_{18}$ alkyl, $C_1$-$C_{18}$ alkoxyphenyl or $C_1$-$C_{18}$ alkylphenyl;
X is selected from any one of the groups represented by formulae (a) to (d):

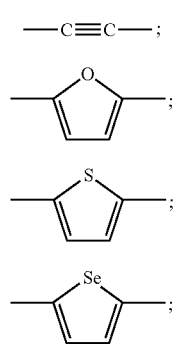

Y is selected from a group represented by formula (e):

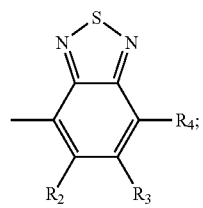

in the formula (e), $R_2$ and $R_3$ are independently selected from H, F, $C_1$-$C_{18}$ alkyl or $C_1$-$C_{18}$ alkoxyphenyl; $R_4$ is selected from any one of the groups represented by formulae (g) to (i):

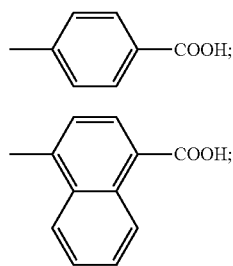

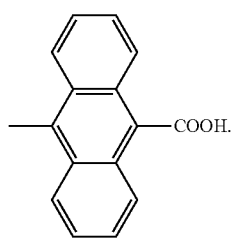

7. The process according to claim 6, wherein the rigid donor compound having the structure of formula (III) or formula (IV) is prepared in accordance with the following method:
subjecting a compound having the structure of formula (V) to oxidation of Jones reagent, esterification of carboxylic acids, and boronation catalyzed by Pd(dppf)Cl$_2$ and potassium acetate successively, to obtain a compound having the structure of formula (VI);
subjecting the compound having the structure of formula (VI) and a compound having the structure of formula (VII) to cross-coupling reaction in the presence of palladium acetate, Sphos and potassium phosphate, to obtain a carboxylic acid ester, which then is subjected to alkylation reaction in the presence of a Grignard reagent, to obtain a compound having the structure of formula (VIII);
subjecting the compound having the structure of formula (VIII) to intramolecular cyclization reaction under acidic catalysis to give the rigid donor compound having the structure of formula (III) or formula (IV);

(V)

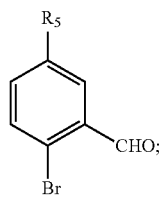

(VI)

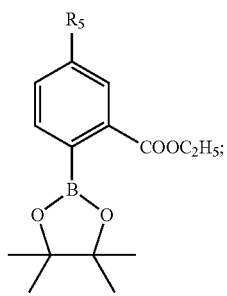

(VII)

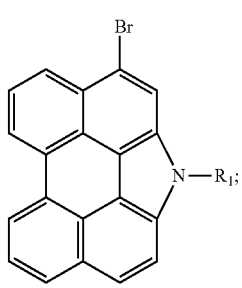

(VIII)

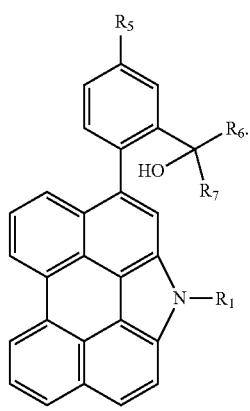

8. A process for producing an organic dye having a rigid donor, which comprises the following steps:

reacting a dye precursor aldehyde having the structure of formula (IX) with cyanoacrylic acid in the presence of ammonium acetate to give an organic dye having the structure of formula (I);

or, reacting a dye precursor aldehyde having the structure of formula (X) with cyanoacrylic acid in the presence of ammonium acetate to give an organic dye having the structure of formula (II);

(IX)

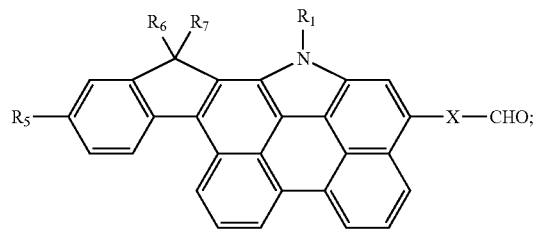

(I)

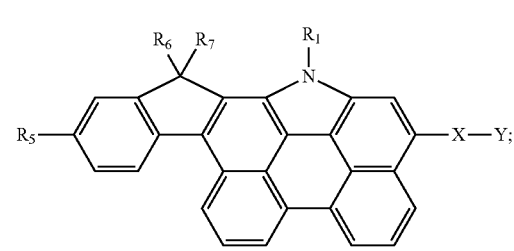

(X)

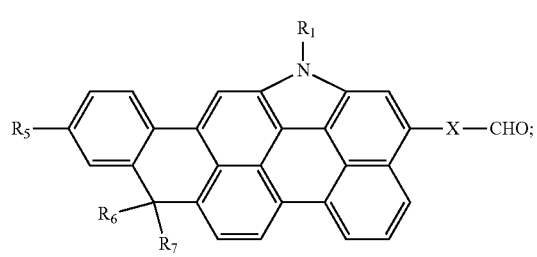

(II)

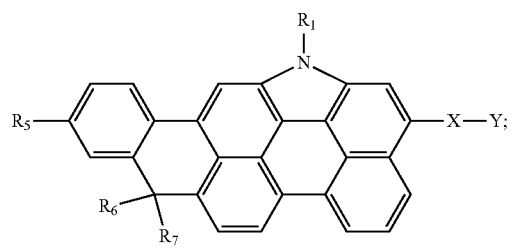

wherein $R_1$ is selected from H or $C_1$-$C_{18}$ alkyl;

$R_5$ is selected from H, $C_1$-$C_{18}$ alkyl or $C_1$-$C_{18}$ alkoxy;

$R_6$ and $R_7$ are independently selected from H, $C_1$-$C_{18}$ alkyl, $C_1$-$C_{18}$ alkoxyphenyl or $C_1$-$C_{18}$ alkylphenyl;

X is selected from any one of the groups represented by formulae (b) to (d):

 (b)

 (c)

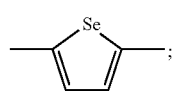 (d)

Y is a group represented by formula (f):

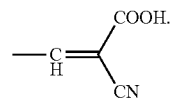 (f)

9. The process according to claim 8, wherein the dye precursor aldehyde having the structure of formula (IX) is produced in accordance with the following method:

reacting a heterocycle-containing compound, N,N-dimethyl formamide and phosphorus oxychloride, to obtain the dye precursor aldehyde having the structure of formula (IX); said heterocycle-containing compound having the structure of formula (XI), formula (XII) or formula (XIII):

(XI)

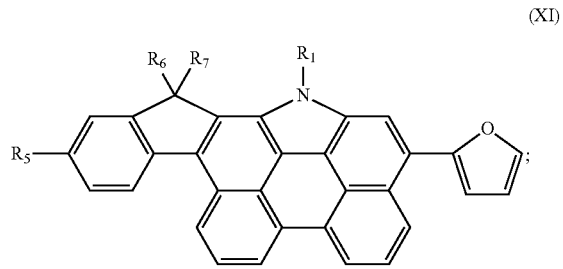

-continued
(XII)
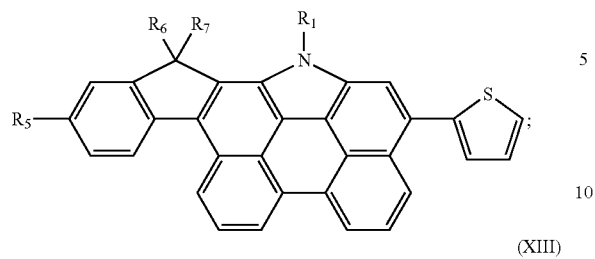
(XIII)
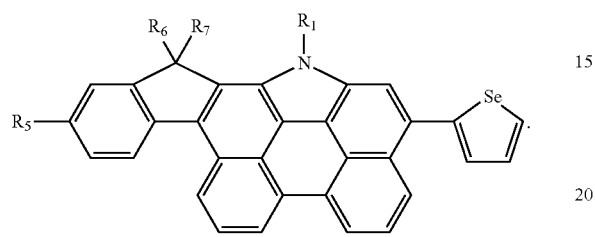
10. A dye-sensitized solar cell, wherein the dye layer is made from the organic dye according to claim 1.
* * * * *